United States Patent
Schindler et al.

(10) Patent No.: US 7,033,926 B2
(45) Date of Patent: Apr. 25, 2006

(54) STRIP CONDUCTOR ARRANGEMENT AND METHOD FOR PRODUCING A STRIP CONDUCTOR ARRANGEMENT

(75) Inventors: Günther Schindler, München (DE); Werner Pamler, München (DE); Zvonimir Gabric, Zorneding (DE)

(73) Assignee: Infineon Technologies, AG, Munich (DE)

( * ) Notice: Subject to any disclaimer, the term of this patent is extended or adjusted under 35 U.S.C. 154(b) by 55 days.

(21) Appl. No.: 10/487,190

(22) PCT Filed: Aug. 9, 2002

(86) PCT No.: PCT/DE02/02946
§ 371 (c)(1),
(2), (4) Date: Jun. 16, 2004

(87) PCT Pub. No.: WO03/019649
PCT Pub. Date: Mar. 6, 2003

(65) Prior Publication Data
US 2005/0079700 A1    Apr. 14, 2005

(30) Foreign Application Priority Data
Aug. 20, 2001 (DE) .............................. 101 40 754

(51) Int. Cl.
*H01L 21/4763* (2006.01)
(52) U.S. Cl. ........................ 438/637; 438/622; 438/421
(58) Field of Classification Search .................. 438/637
See application file for complete search history.

(56) References Cited

U.S. PATENT DOCUMENTS

| 5,510,645 A | 4/1996 | Fitch et al. |
| 5,792,706 A | 8/1998 | Michael et al. |
| 5,908,318 A | 6/1999 | Wang et al. |
| 6,242,336 B1 * | 6/2001 | Ueda et al. ................. 438/619 |
| 6,472,266 B1 * | 10/2002 | Yu et al. ..................... 438/241 |
| 6,890,830 B1 * | 5/2005 | Tamaoka et al. ............ 438/421 |
| 6,914,318 B1 * | 7/2005 | Lee et al. .................... 257/522 |

FOREIGN PATENT DOCUMENTS

EP    1026726    8/2000

OTHER PUBLICATIONS

Kusuki, T., et al., "Spontaneous Etching of $SiO_2$ Employing $H_2/NF_3$ Downstream Plasma", Extended Abstracts of the Electrochemical Society, vol. 93, No. 1, pp. 375-376, 1993.

(Continued)

*Primary Examiner*—Thao P. Le
(74) *Attorney, Agent, or Firm*—Dicke, Billig & Czaja, PLLC

(57) ABSTRACT

An interconnect arrangement comprises a substrate made from a first insulating material with a substrate surface, at least two interconnects which are arranged next to one another in the substrate, a buffer layer made from a second insulating material above the substrate and comprising a buffer-layer surface, which is parallel to the substrate surface, at least one cavity, which is arranged between the interconnects and, with respect to the buffer-layer surface, extends deeper into the substrate than the interconnects, and a covering layer made from a third insulating material, which is arranged above the buffer layer and completely closes off the cavity with respect to the buffer-layer surface.

27 Claims, 12 Drawing Sheets

OTHER PUBLICATIONS

Fleming, J.G., et al. "Lowering of Intralevel Capacitance Using Air Gap Structures," Conference Proceedings ULSI XII, Materials Research Society, pp. 471-477, 1997.

Shieh, B. et al., "Air-Gap Formation During IMD Deposition to Lower Interconnect Capacitance," IEEE Electron Device Letters, vol. 19, No. 1, pp. 16-18, 1998.

Shieh, B, et al., "Integration and Reliability Issues for Low Capacitance Air-Gap Interconnect Structures," IEEE Proc. 1998 IITC, pp. 125-127, 1998.

Ueda, T., et al. "A Novel Air Gap Integration Scheme for Multi-level Interconnects Using Self-aligned Via Plugs," IEEE Proc. 1998 Symp. VLSI Techn. Digest of Technical Papers, pp. 46-47, 1998.

Shieh, B. et al., "Air Gaps Lower k of Interconnect Dielectrics," Solid State Technology, pp. 51-58, Feb. 1999.

Ueda, T., et al., "Integration of 3 Level Air Gap Interconnect for Sub-quarter Micron CMOS," IEEE Proc. 1999 Symp. VLSI Techn. Digest of Technical Papers, 1999.

Arnal, V., et al. "A Novel $SiO_2$-Air Gap Low K for Copper Dual Damascene Interconnect," Advanced Metallization Conference 2000, pp. 71-76.

Arnal, V., et al., "Integration of a 3 Level Cu-$SiO_2$ Air Gap Interconnect for Sub 0.1 micron CMOS Technologies," IEEE Proc. 2001 IITC, 2001.

* cited by examiner

STRIP CONDUCTOR ARRANGEMENT AND METHOD FOR PRODUCING A STRIP CONDUCTOR ARRANGEMENT

CROSS-REFERENCE TO RELATED APPLICATIONS

This application is a U.S. National-Stage entry under 35 U.S.C. § 371 based on International Application No. PCT/DE02/02946, filed 09 Aug. 2002, which was published under PCT Article 21(2); this application also claims priority under 35 U.S.C. § 119 to German Application No. DE 101 40 754.8, filed Aug. 20, 2001.

BACKGROUND OF THE INVENTION

The invention relates to an interconnect arrangement and to a method for fabricating an interconnect arrangement.

Integrated circuit arrangements are being produced with an ever greater packing density. The result of this is that interconnects in metallization layers are at an ever decreasing spacing from one another. As a result, capacitances which are formed between the interconnects rise and lead to high signal propagation times, high power losses and crosstalk. Hitherto, $SiO_2$, the relative dielectric constant of which is $\epsilon_r=3.9$, has primarily been used as the dielectric for providing insulation between the interconnects.

There are a number of known methods for reducing the relative dielectric constant $\epsilon_r$ and therefore for reducing the capacitance between interconnects within an interconnect layer, for example from J. G. Fleming et al.: "Lowering of Intralevel Capacitance Using Air Gap Structures", Conference Proceedings ULSI XII, Materials Research Society, pp. 471–477, 1997; T. Ueda et al.: "A Novel Air Gap Integration Scheme for Multi-level Interconnects using Self-aligned Via Plugs", IEEE Proc. 1998 Symp. VLSI Techn. Digest of Technical Papers, pp. 46–47, 1998; B. Shieh et al.: "Integration and Reliability Issues for Low Capacitance Air-Gap Interconnect Structure", IEEE Proc. 1998 IITC, pp. 125–127, 1998; B. Shieh et al.: "Air-Gap Formation During IMD Deposition to Lower Interconnect Capacitance", IEEE Electron Device Letters, Vol. 19, No. 1, pp. 16–18, 1998; B. Shieh et al.: "Air gaps lower k of interconnect dielectrics", Solid State Technology, pp. 51–58, February 1999; T. Ueda et al.: "Integration of 3 Level Air Gap Interconnect for Sub-quarter Micron CMOS", IEEE Proc. 1999 Symp. VLSI Techn. Digest of Technical Papers, 1999; V. Arnal et al.: "Integration of a 3 Level Cu—$SiO_2$ Air Gap Interconnect for Sub 0.1 micron CMOS Technologies", IEEE Proc. 2001 IITC, 2001; and V. Arnal et al.: "A Novel $SiO_2$-Air Gap Low K for Copper Dual Damascene Interconnect", Conference Proceedings ULSI XVI, Materials Research Society, pp. 71–76, 2001.

According to the prior art, cavities are produced between the interconnects within an interconnect layer. The insulating dielectric, which determines the capacitance between the interconnects, therefore has a relative dielectric constant $\epsilon_r$ which is almost equal to 1. For insulation purposes, the interconnects themselves are enclosed at the top and bottom by solid $SiO_2$ layers.

Since the capacitances of the insulating layers above and below also make a not insignificant contribution to the overall capacitance between interconnects which adjoin one another within a layer, and these insulating layers still consist of solid $SiO_2$ material, the high relative dielectric constant $\epsilon_r$ of these insulating layers has a considerable influence onto the overall capacitance between the adjacent interconnects.

SUMMARY OF THE INVENTION

The invention is therefore based on the problem of providing an interconnect arrangement and a method for fabricating an interconnect arrangement in which the cavities between the interconnects take up as much space as possible, with a suitable geometry and distribution.

The problem is solved by an interconnect arrangement and by a method for fabricating an interconnect arrangement.

An interconnect arrangement comprises a substrate made from a first electrically insulating material with a substrate surface. Furthermore, at least two electrically conductive interconnects, which comprise an electrically conductive material, are arranged in the substrate. Moreover, the interconnect arrangement comprises a buffer layer made from a second electrically insulating material above the substrate surface, the buffer layer comprising a buffer-layer surface, which is parallel to the substrate surface. At least one cavity extends from the buffer-layer surface through the buffer layer into the substrate, the cavity being arranged between the interconnects and, with respect to the buffer-layer surface, extending deeper into the substrate than the interconnects. Above the buffer layer, there is arranged a covering layer which comprises a third electrically insulating material and completely closes off the cavity with respect to the buffer-layer surface.

In a method for fabricating an interconnect arrangement, first of all at least two electrically conductive interconnects are produced in a substrate below a substrate surface, the substrate comprising a first electrically insulating material and the interconnects comprising an electrically conductive material. The interconnects are arranged next to one another in the substrate. Then, a buffer layer made from a second electrically insulating material is produced above the substrate surface, the buffer layer comprising a buffer-layer surface, which is parallel to the substrate surface. Then, a cavity, which runs between the interconnects and extends from the buffer-layer surface through the buffer layer into the substrate, is produced, the cavity, with respect to the buffer-layer surface, extending deeper into the substrate than the interconnects. Finally, a covering layer made from a third electrically insulating material is produced above the buffer layer, so that the cavity is completely closed off with respect to the buffer-layer surface. The substrate, the interconnects, the buffer layer and the covering layer therefore form the interconnect arrangement.

One advantage of the invention is that, on account of the very large cavity as insulating layer between adjacent interconnects, the effective relative dielectric constant $\epsilon_r$ of the insulating layer between the adjacent interconnects deviates only slightly from one, and therefore the capacitance between these interconnects is reduced. The interconnect arrangement allows a considerable reduction in the overall capacitance within an integrated circuit.

A further advantage of the interconnect arrangement is that the cavity considerably reduces undesirable leakage fields between the interconnects, which are produced by the interconnects above and/or below the actual interconnect layer in the interconnect arrangement. Therefore, the effective relative dielectric constant $\epsilon_r$, which is influenced both by the relative dielectric constant of the cavity and by that of the surrounding material, is approximately two. In this case, the value of the effective relative dielectric constant $\in_r$ is dependent on the geometry of the entire interconnect arrangement.

Furthermore, there is the advantage of a high stability during the fabrication of the interconnect arrangement, since, during the planarization of the interconnects in a chemical mechanical polishing (CMP) operation during production of the interconnects, the latter are still embedded in the solid substrate. The cavity is only introduced into the substrate after the interconnects have been produced, and therefore the mechanical stability of the substrate is only reduced at that time.

Moreover, coupling capacitances between the interconnects are avoided on account of etching and/or CMP stop layers. This is because these stop layers, during production of the cavity, preferably by means of etching, are interrupted in such a manner that adjacent interconnects are not in physical contact as a result of a stop layer of this type.

After completion of the interconnect arrangement, the cavity preferably contains air, a vacuum or an electrically insulating gas in order to improve the resistance to electrical spark-overs, for example sulphur hexafluoride ($SF_6$).

The interconnects may be buried in the substrate.

The cavity preferably extends partially into the covering layer situated on the substrate. This contributes to an additional reduction in the effective relative dielectric constant $\in_r$.

In a preferred embodiment of the interconnect arrangement according to the invention, the covering layer, in the region of the buffer layer, extends partially into the cavity. In this case, the covering layer, as seen from the buffer-layer surface, comprises a decreasing edge coverage in the cavity, so that the covering layer in the cavity does not extend all the way to the substrate surface. This configuration of the interconnect arrangement results from the method which is used to fabricate the cavity or the covering layer, as described below. The decreasing edge coverage within the cavity is important so that, according to this embodiment of the invention, there is no increase in the effective relative dielectric constant $\in_r$.

The covering layer preferably covers the buffer layer, and there is at least one additional cavity between the interconnects and the buffer-layer surface, above the interconnects. Consequently, this additional cavity can extend less deeply into the substrate than the cavity, since the additional cavity is delimited at the bottom by the interconnects. The additional cavity allows the effective relative dielectric constant $\in_r$ to be additionally reduced, since consequently it is also possible to dispense with a solid insulating layer with a high effective relative dielectric constant $\in_r$ above the interconnects.

To allow additional interconnect layers to be applied to the interconnect arrangement, the covering layer is preferably delimited by a covering-layer surface which is arranged parallel to the substrate surface.

Preferably a plurality of cavities extends between two adjacent interconnects into the substrate starting from the buffer-layer surface. If a plurality of cavities of small volume are used instead of a single cavity of large volume, the small cavities being separated from one another by means of thin partition walls, it is possible to increase the stability of the interconnect arrangement according to the invention. The thin partition walls then serve as a type of mechanical support for additional interconnect layers arranged above the interconnect arrangement according to the invention. Obviously, the thin partition walls can also be referred to as posts.

According to a preferred embodiment of the interconnect arrangement according to the invention, a supporting layer made from a fourth electrically insulating material is arranged above the buffer-layer surface. The fourth electrically insulating material is different from the first, second and third electrically insulating material, and the third electrically insulating material can be deposited selectively only on the fourth electrically insulating material.

It is preferable for a stop layer to be provided in the substrate below the interconnects relative to the substrate surface. This stop layer delimits the cavity at the bottom. The stop layer is designed in particular as a barrier for the etching process which is to be used to fabricate the cavity, so that during the etching of the substrate the depth of the cavity which is to be etched can be set exactly. If, in a separate etching process in uncovered regions of the stop layer, the latter is removed selectively until regions of the substrate which lie below it have been uncovered, the depth of the cavity can additionally be increased by the thickness of the stop layer. This allows the effective relative dielectric constant $\in_r$ to be reduced further.

In addition, an additional stop layer may be provided above both the supporting layer and the covering layer, and additional interconnect layers can then be provided on the additional stop layer. In this case, the additional stop layer serves as a barrier to protect the structures located beneath this additional stop layer during fabrication of the additional interconnect layers located above it.

The interconnects are preferably arranged at a spacing from one another which is less than the extent of the cavity in the direction of the spacing between the interconnects above and/or below the interconnects. Obviously, the shape of the cavity is then similar to an "I" or to a bone. The greater extent of the cavity above and/or below the interconnects contributes to additionally reducing the effective relative dielectric constant $\in_r$.

It is preferable for the first electrically insulating material and the second electrically insulating material to be identical. Furthermore, the first electrically insulating material and/or the second electrically insulating material and/or the third electrically insulating material and/or the fourth electrically insulating material are/is preferably a low-k material which has a relative dielectric constant $\in_r$ in the range between 1 and 4. Since the covering layer also makes a contribution to the overall capacitance between adjacent interconnects, it should be ensured that the third electrically insulating material, which is used for the covering layer, also has a low relative dielectric constant $\in_r$.

In a preferred embodiment of the interconnect arrangement according to the invention, the first electrically insulating material and/or the second electrically insulating material and/or the third electrically insulating material and/or the fourth electrically insulating material include(s) an organic material. However, the first electrically insulating material and/or the second electrically insulating material and/or the fourth electrically insulating material of the interconnect arrangement preferably include(s) silicon dioxide ($SiO_2$). If organic material is used, it is preferable for polymers to be applied in a methane environment during a PECVD process (PECVD=plasma enhanced chemical vapour deposition).

The interconnects are preferably arranged at substantially the same depth with respect to the substrate surface, and the cavity extends substantially vertically into the substrate.

According to a further preferred embodiment of the interconnect arrangement according to the invention, the interconnects are encapsulated by a thin encapsulation layer made from an encapsulation material. The encapsulation material is mechanically harder than the electrically conductive material, mechanically harder than the first electrically insulating material and mechanically harder than the second electrically insulating material. The encapsulation of the interconnects serves to increase the resistance of the interconnects to electromigration if a mechanically soft material, for example an organic material, is selected as the first electrically insulating material and/or as the second electrically insulating material. The encapsulation material may, for example, be a nitride compound.

The interconnects may be arranged at least partially on electrically conductive regions in the substrate, so that electrical contacts can be made between various interconnect layers.

In a preferred method for fabricating an interconnect arrangement, an additional cavity is produced above the interconnects between the buffer-layer surface and the interconnects before the covering layer is produced. In this case, the additional cavity is delimited at the bottom by the interconnects, so that the additional cavity extends less deeply into the buffer layer or into the substrate than the cavity.

In a preferred embodiment of the method, the covering layer is produced in a process with a low edge coverage, i.e. in a non-conformal process. A process of this type ensures that only small amounts of third electrically insulating material, from which the covering layer is formed, can penetrate into the cavity. Therefore, undesirable filling of the cavity with third electrically insulating material is hindered. The third electrically insulating material of the covering layer is preferably deposited by means of a CVD process (CVD=chemical vapour deposition) with the minimum possible edge coverage. For this purpose, the CVD process is operated in the diffusion-determined parameter range, preferably by means of an increased pressure. As an alternative to using a CVD process, the third electrically insulating material for fabricating the covering layer may also be applied by means of a sputtering process. A third electrically insulating material, which possibly has penetrated deep into the cavity, can be removed again during an interruption to the production of the covering layer with the aid of a short isotropic etch, for example a wet-chemical etch or a dry etch in a downstream etching process. A downstream etching process of this type which can be used in accordance with the invention is described in T. Kusuki et al., Extended Abstracts of the Electrochemical Society, Vol. 93, No. 1, p. 375, 1993. Alternatively, the third electrically insulating material may also be applied by means of what is known as a spin-on process if the third electrically insulating material has a sufficient surface tension. In this case, the wetting of the buffer-layer surface should be kept as low as possible, so that as little third electrically insulating material as possible penetrates into the cavity.

The covering layer may, for example, be produced in such a manner that, first of all, third electrically insulating material is deposited above the buffer-layer surface by means of a non-conformal process, until the cavity is closed off at the top. Then, third electrically insulating material is deposited above this by means of a conformal standard process. The geometry of the cavity should be selected in such a manner that during the non-conformal process scarcely any third electrically insulating material penetrates into the cavity which forms. As a result, there is only a slight coverage of the cavity walls with third electrically insulating material, with the result that the relative dielectric constant $\in_r$ of the overall interconnect arrangement is only influenced to an insignificant extent. In the case of relatively small feature sizes, such as for example a very large scale integrated circuit (VLSI circuit), it is no longer possible to detect any coverage of the cavity walls with third electrically insulating material.

The cavity is preferably produced as follows: First of all, a suitable etching mask is produced on the supporting layer. Then, material from the supporting layer, the buffer layer and the substrate is removed in a predetermined way by means of an etching process in regions of the supporting layer which are not covered by means of the etching mask. Finally, the etching mask is removed again.

The cavity is preferably closed up in the following way: First of all, third electrically insulating material is deposited selectively only on the fourth electrically insulating material at least until the cavity has been completely closed off. Then, the third electrically insulating material which has been deposited on the supporting layer is partially removed again by means of chemical mechanical polishing. In this way, the covering layer is levelled, so that a planar surface is formed for interconnect layers which are additionally to be applied above the covering layer.

BRIEF DESCRIPTION OF THE DRAWINGS

Exemplary embodiments of the invention are illustrated in the figures and explained in more detail below. In the figures, identical reference symbols denote identical components. In the drawings.

DETAILED DESCRIPTION

Figure 1:
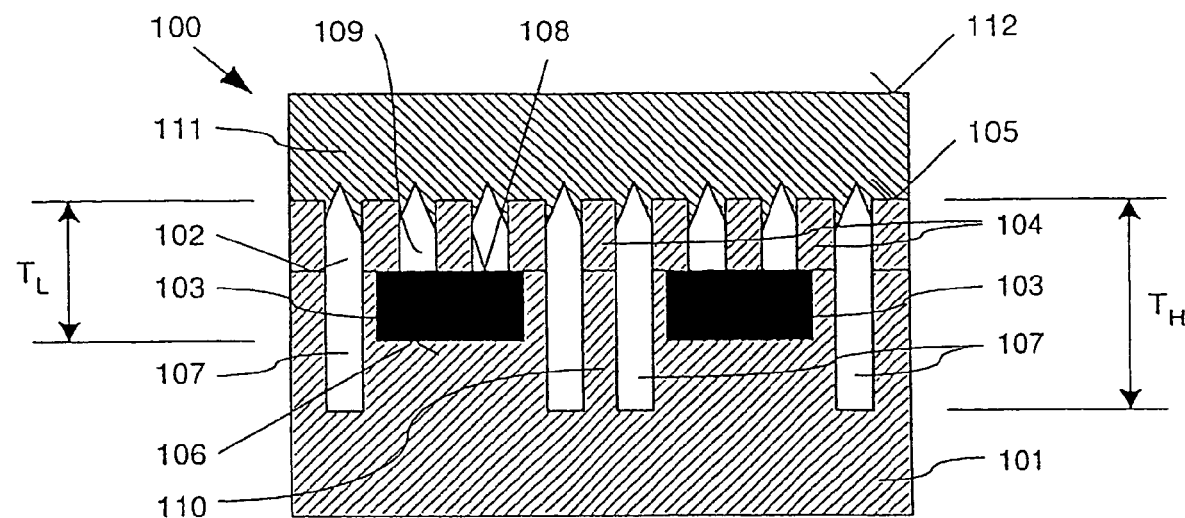
FIG. 1 shows a cross section perpendicular to the substrate surface through an interconnect arrangement in accordance with a first exemplary embodiment of the invention.

FIG. 1 shows a cross section perpendicular to the substrate surface 102 through an interconnect arrangement 100 in accordance with a first exemplary embodiment of the invention.

The interconnect arrangement 100 comprises a substrate 101 with a substrate surface 102. On the substrate surface 102 there is arranged a buffer layer 104 which comprises a buffer-layer surface 105 oriented parallel to the substrate surface 102 above the buffer layer 104. The substrate material selected is a first electrically insulating material, in accordance with this exemplary embodiment solid silicon dioxide ($SiO_2$). The material selected for the buffer layer 104 is a second electrically insulating material, in accordance with this exemplary embodiment once again solid silicon dioxide ($SiO_2$). In the substrate 101 there are a plurality of buried interconnects 103 which are arranged next to one another in such a manner that the respective lower interconnect surface 106, perpendicular to the buffer-layer surface 105, has a spacing of an interconnect depth $T_L$ which is greater than the vertical thickness of the interconnects 103. The interconnects 103 comprise an electrically conductive material, which according to the present exemplary embodiment is aluminium or copper.

Between the interconnects 103, cavities 107 extend from the buffer-layer surface 105 through the buffer layer 104 and into the substrate 101, these cavities having a cavity depth $T_H$. The cavity depth $T_H$ is greater than the interconnect depth $T_L$, with the result that leakage fields between adjacent interconnects 103 in the regions of the buffer layer 104 or of the substrate 101 directly above and below the interconnects 103 are reduced. Between the interconnects 103 and the buffer-layer surface 105, there are additional cavities 109 on the upper surface 108 of at least part of the interconnects 103, these additional cavities likewise contributing to reducing the leakage fields. The cavities 107 and the additional cavities 109 are arranged in such a manner in the buffer layer 104 and in the substrate 101 that there are posts 110 between them. The shape of the posts 110 can be as desired and, according to the present exemplary embodiment, equates to a straight prism with a square base surface. Alternatively, by way of example it would also be possible for columns with a circular base surface to be used as posts 110.

On the buffer-layer surface 105 there is a covering layer 111 of a third electrically insulating material, which according to this exemplary embodiment is once again solid silicon dioxide ($SiO_2$), which closes off the cavities 107 and the additional cavities 109 in the direction of the buffer-layer surface 105. The covering layer 111 is delimited at the top by a covering-layer surface 112 which is oriented parallel to the substrate surface 102. The covering-layer surface 112 serves to allow additional layers with semiconductor components or contact elements to be applied in a simple manner to the interconnect arrangement 100 in subsequent processes.

During fabrication of the covering layer 111, it was possible for silicon dioxide (SiO$_2$) to penetrate into the cavities 107 between adjacent interconnects 103 as well as into the additional cavities 109 above the interconnects 103. This resulted in a thin coverage of the cavity walls with third electrically insulating material. The smaller the spacing of adjacent posts 110, the lower the coverage of the cavity walls with third electrically insulating material. Consequently, a small part of the covering layer 111 extends into the cavities 107 and into the additional cavities 109, where the edge coverage by the covering layer 111 decreases at decreasing distance from the substrate surface 102. This is a result of the preferred method which is used to produce the covering layer 111 and which is described below. In alternative fabrication methods, the covering layer 111 may end flush with the buffer-layer surface 105, so that no third electrically insulating material of the covering layer 111 passes into the cavities 107 and the additional cavities 109.

The spacing between the posts 110 and their geometry should preferably be selected in such a manner that the interconnect arrangement 100 has a sufficient load-bearing capacity for the covering layer 111 and for additional layers and metallization layers arranged above the interconnect arrangement 100. According to this exemplary embodiment, the posts 110 each comprise a width which is almost equal to the spacing between the posts 110. According to this exemplary embodiment, the cavity depth $T_H$ corresponds to twice the thickness of the interconnects 103. Alternatively, other dimensions may also be selected for the width and/or the spacing of the posts 110 and/or for the cavity depth $T_H$ with respect to the thickness of the interconnects 103.

The base surface of the posts 110 should approximately correspond to the minimum feature size of the semiconductor chip in which the interconnect arrangement 100 is used.

The following text provides a stepwise description of a fabrication method for forming the interconnect arrangement 100 in accordance with the first exemplary embodiment of the invention. The method is divided into a first part with two different configurations and a second, common part. In the first configuration of the first part of the method, the Damascene technique is used, and in the second configuration of the first part of the method the metal-etching technique is used. The Damascene technique is preferably used if copper is used as material for the interconnects 103, while the metal-etching technique is preferably used if aluminium is used as material for the interconnects 103. During the second part of the method, the result of the first part of the method is processed further, and consequently the second part of the method is identical for both embodiments of the first part of the method.

Figure 2:
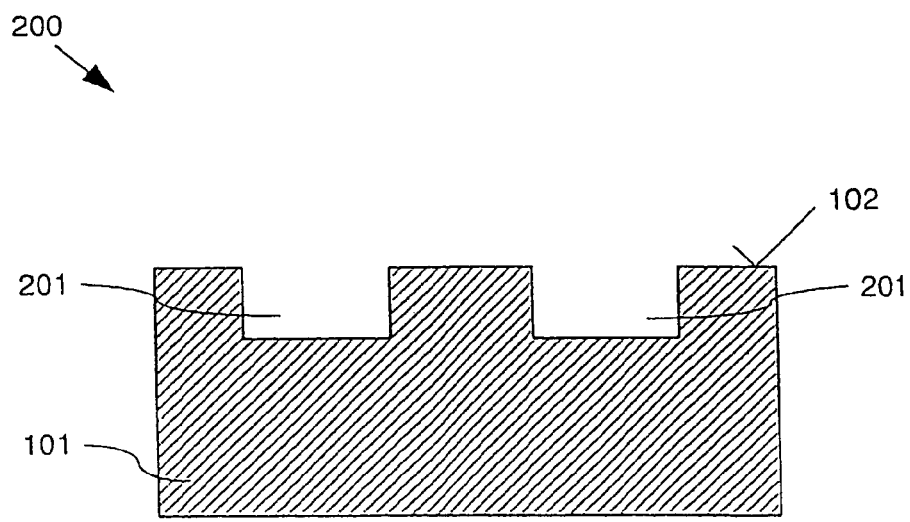
FIG. 2 shows a cross section perpendicular to the substrate surface through an as yet incomplete interconnect arrangement as shown in FIG. 1 at a first time during a first part of a method for fabricating the interconnect arrangement in accordance with the first exemplary embodiment.

FIG. 2 shows a cross section perpendicular to the substrate surface 102 through an as yet incomplete interconnect arrangement 200 at a first time during the first configuration of the first part of the method for fabricating the interconnect arrangement 100 shown in FIG. 1.

A substrate 101 with a substrate surface 102 is used as the basis for the Damascene technique. The substrate 101 is planar and is coated in such a manner that at the substrate surface 102 it comprises silicon dioxide (SiO$_2$). In the substrate 101 there are trenches 201 which are formed in the substrate 101 from the substrate surface 102 by means of standard lithography and etching techniques. The shapes and positions of the trenches 201 correspond to those of the subsequent interconnects 103. In particular, the depth of the trenches 201 preferably corresponds to the thickness of the subsequent interconnects 103.

To define the depth of the trenches 201, it is also possible for an etching stop layer to be incorporated into the substrate 101 at a predetermined distance from the substrate surface 102. During the etching process for production of the trenches 201, substrate material is removed in the depth of the substrate 101 until the etching stop layer is reached.

Figure 3:
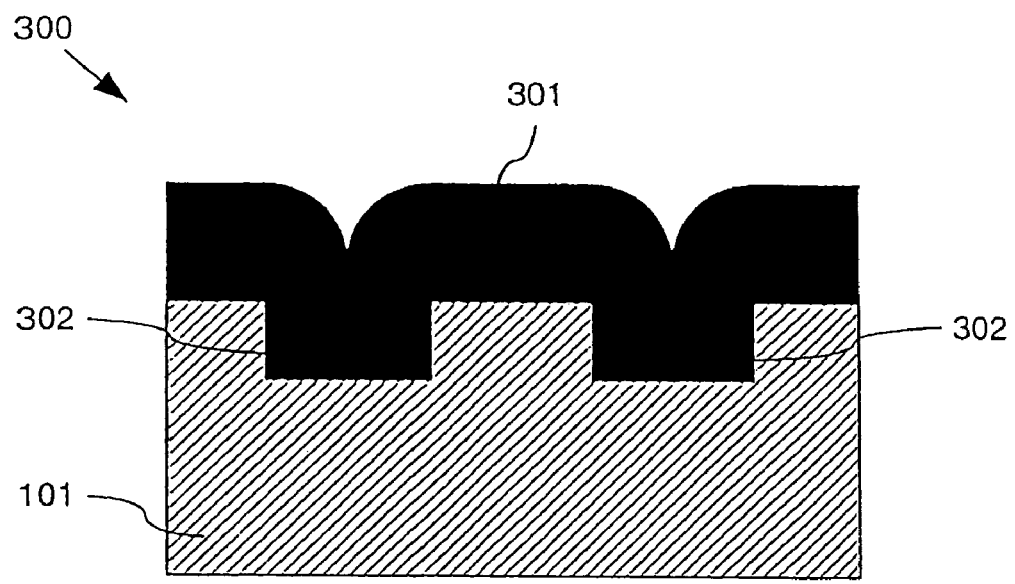
FIG. 3 shows a cross section perpendicular to the substrate surface through an as yet incomplete interconnect arrangement as shown in FIG. 1 at a second time during the first part of the method for fabricating the interconnect arrangement in accordance with the first exemplary embodiment.

Then, in a standard metallization process, copper is deposited above the substrate 101 with the trenches 201 (cf. as yet incomplete interconnect arrangement 300 in FIG. 3). In this way, a metal layer 301 of copper is formed above the substrate surface 202. The trenches 201 are overfilled with copper and filled trenches 302 are formed.

Figure 4:
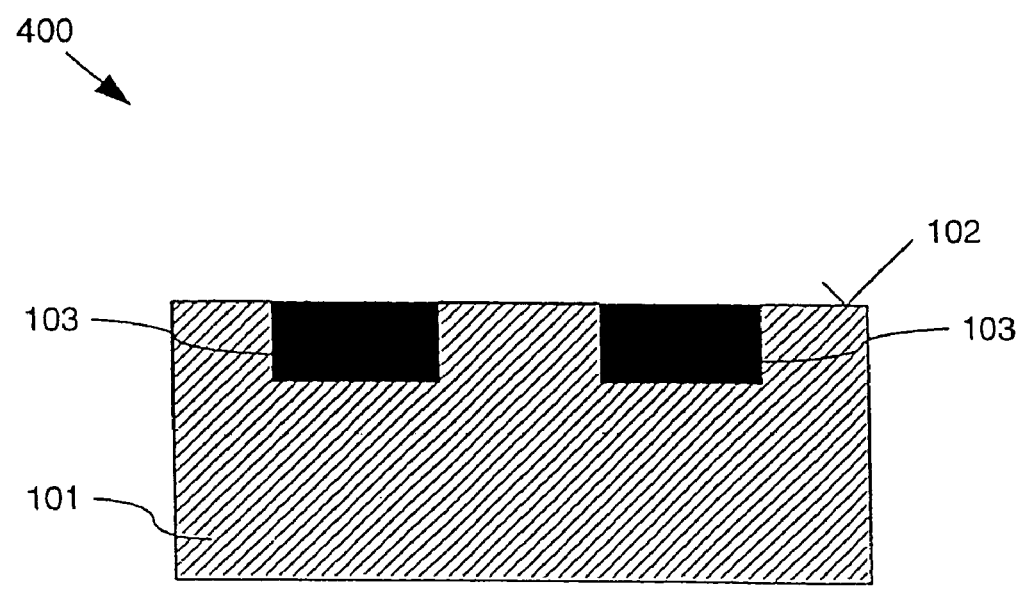
FIG. 4 shows a cross section perpendicular to the substrate surface through an as yet incomplete interconnect arrangement as shown in FIG. 1 at a third time during the first part of the method for fabricating the interconnect arrangement in accordance with the first exemplary embodiment.

To produce a planar surface, the metal layer 301 is removed by flattening over the entire surface until the substrate 101 is reached (cf. as yet incomplete interconnect arrangement 400 shown in FIG. 4). A chemical mechanical polishing operation is used for this purpose. According to the present embodiment, the resulting planar surface is identical to the substrate surface 102. In the process, the copper which has overfilled the filled trenches 302 is removed, and therefore the interconnects 103 are formed from the filled trenches 302.

Figure 5:
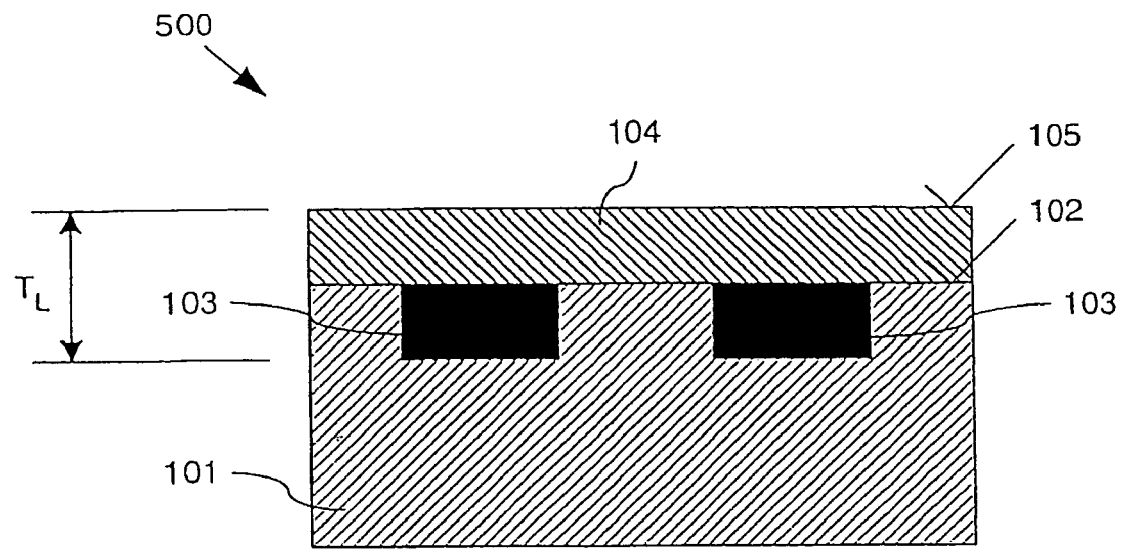
FIG. 5 shows a cross section perpendicular to the substrate surface through an as yet incomplete interconnect arrangement as shown in FIG. 1 at a fourth time during the first part of the method for fabricating the interconnect arrangement as shown in the first exemplary embodiment.

A buffer layer 104 of silicon dioxide (SiO$_2$) is applied to the substrate 101 with the interconnects 103 (cf. as yet incomplete interconnect arrangement 500 in FIG. 5). The buffer layer 104 is delimited at the top by a buffer-layer surface 105, which is parallel to the substrate surface 102. The thickness of the buffer layer 104 is such that it results in the desired interconnect depth $T_L$ between the bottom edge of the interconnects 103 and the buffer-layer surface 105.

Figure 6:
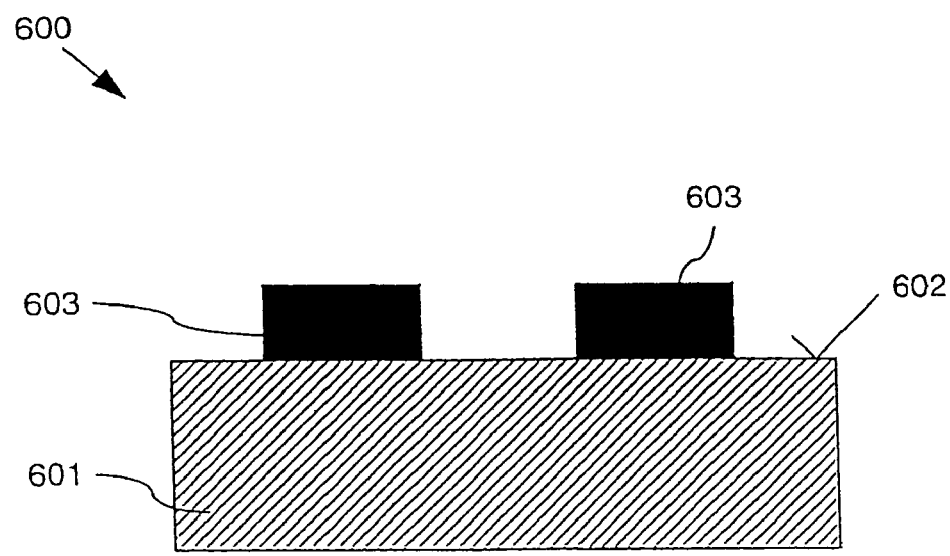
FIG. 6 shows a cross section perpendicular to the substrate surface through an as yet incomplete interconnect arrangement as shown in FIG. 1 at a first time during an alternative first part of the method for fabricating the interconnect arrangement in accordance with the first exemplary embodiment.

FIG. 6 shows a cross section perpendicular to the substrate surface 602 through an as yet incomplete interconnect arrangement 600 at a first time during the second configuration of the first part of the method for fabricating the interconnect arrangement 100 shown in FIG. 1.

The basis used for the metal-etching technique is a substrate 601 with a substrate surface 602. The substrate material is silicon dioxide (SiO$_2$). There are interconnects 603 made from aluminium on the substrate surface 602. The interconnects 603 are produced by first of all producing an areal aluminium layer above the substrate surface 602. Then, the aluminium layer is patterned by means of standard lithography and etching techniques, with the interconnects 603 being formed from the aluminium layer. The aluminium layer is patterned in accordance with the desired shapes and positions of the interconnects 603.

Figure 7:
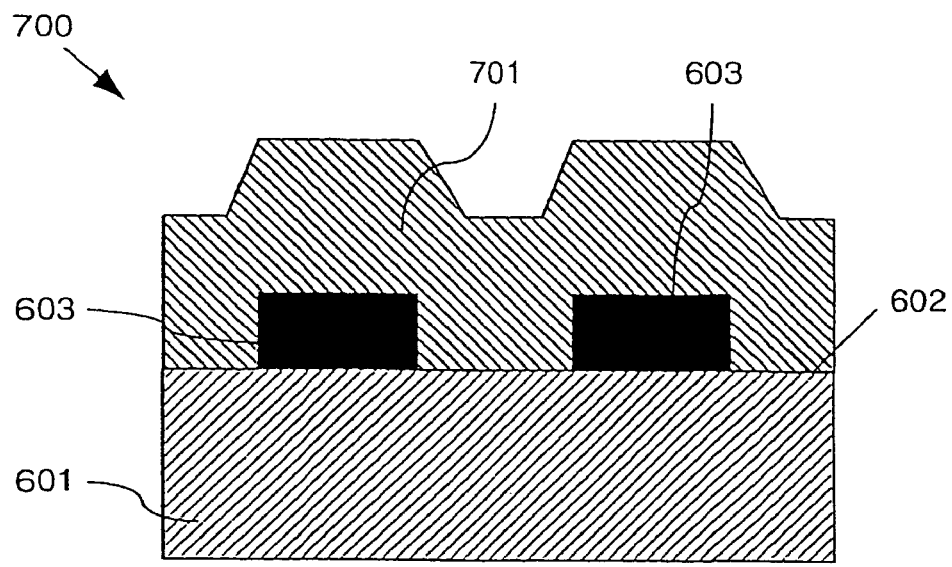
FIG. 7 shows a cross section perpendicular to the substrate surface through an as yet incomplete interconnect arrangement as shown in FIG. 1 at a second time during the alternative first part of the method for fabricating the interconnect arrangement in accordance with the first exemplary embodiment.

A conformal cladding layer 701 is produced above the interconnects 603 and the substrate surface 602 by means of a conformal deposition of silicon dioxide (SiO$_2$) (cf. as yet incomplete interconnect arrangement 700 in FIG. 7). The spaces between the interconnects 603 are also filled with silicon dioxide (SiO$_2$). The thickness of the cladding layer 701 should be greater than the thickness of the interconnects 603. The thickness of the cladding layer 701 should be dimensioned in the following way: After the subsequent fabrication step, on the one hand there should still be sufficient silicon dioxide (SiO$_2$) above the interconnects 603, and on the other hand it should be possible for a planar surface to be formed parallel to the substrate surface 602.

Figure 8:
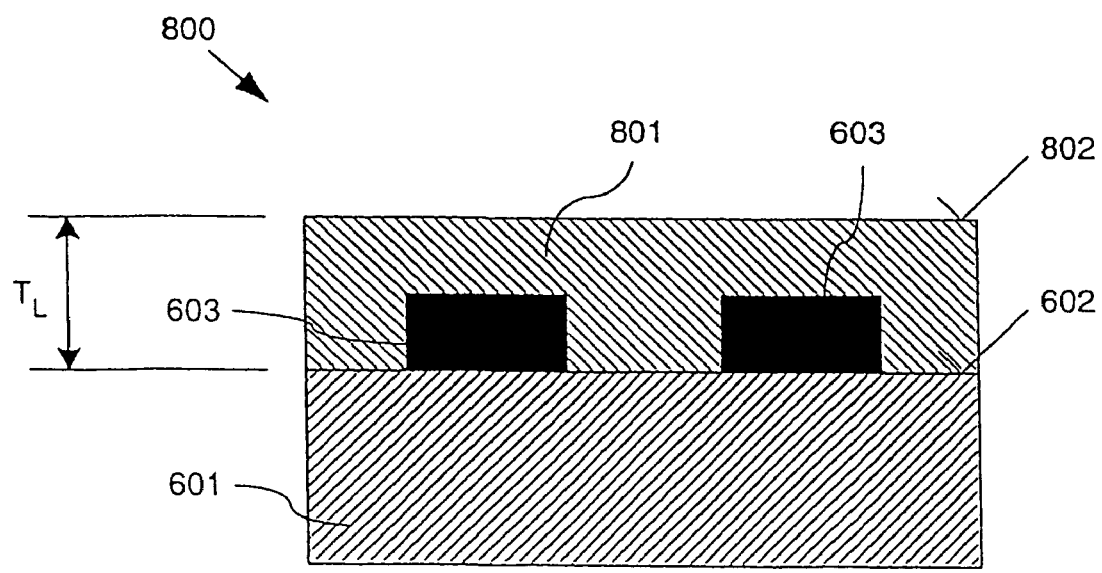
FIG. 8 shows a cross section perpendicular to the substrate surface through an as yet incomplete interconnect arrangement as shown in FIG. 1 at a third time during the alternative first part of the method for fabricating the interconnect arrangement in accordance with the first exemplary embodiment.

To produce a planar cladding-layer surface 802, the cladding layer 701 is partially removed until the cladding-layer surface 802 is flat and oriented parallel to the substrate surface 602 (cf. as yet incomplete interconnect arrangement 800 in FIG. 8). A planarized cladding layer 801 is formed from the cladding layer 701. A chemical mechanical polishing operation is used to partially remove the cladding layer 701. The chemical mechanical polishing operation is ended as soon as the distance between the substrate surface 602 and the cladding-layer surface 802 is equal to the desired interconnect depth $T_L$.

Figure 9:
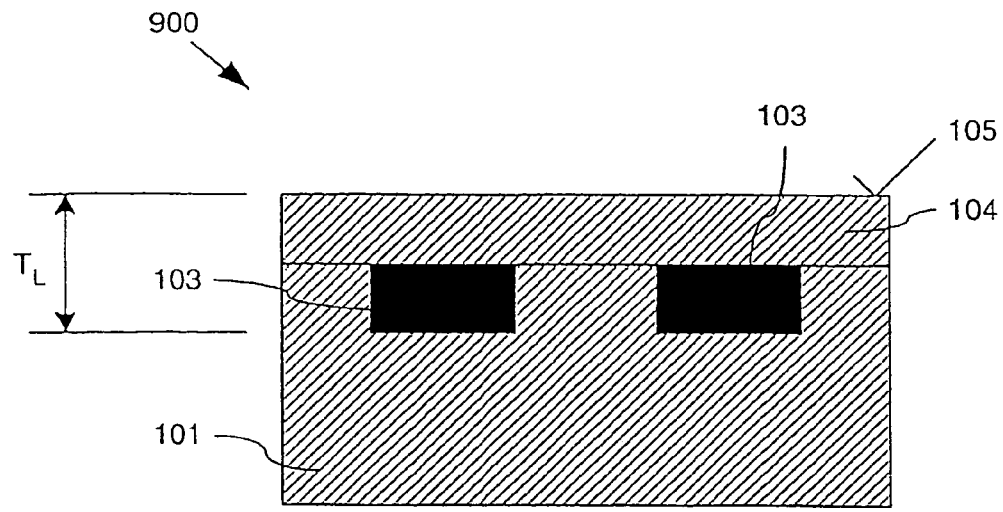
FIG. 9 shows a cross section perpendicular to the substrate surface through an as yet incomplete interconnect arrangement as shown in FIG. 1 at a first time during a second part of the method for fabricating the interconnect arrangement in accordance with the first exemplary embodiment.

FIG. 9 shows a cross section perpendicular to the substrate surface 102 through an as yet incomplete interconnect arrangement 900 at a first time during the second part of the method for fabricating the interconnect arrangement 100 shown in FIG. 1.

The as yet incomplete interconnect arrangement 900 represents the results of the two embodiments of the first part of the method and forms the starting point for the second part of the method. The substrate 101 with the embedded interconnects 103 represents a combination of the substrate 601 with the interconnects 603 and the planarized cladding layer 801 in accordance with the second embodiment. In this case, the buffer-layer surface 105 is identical to the cladding-layer surface 802.

Figure 10:
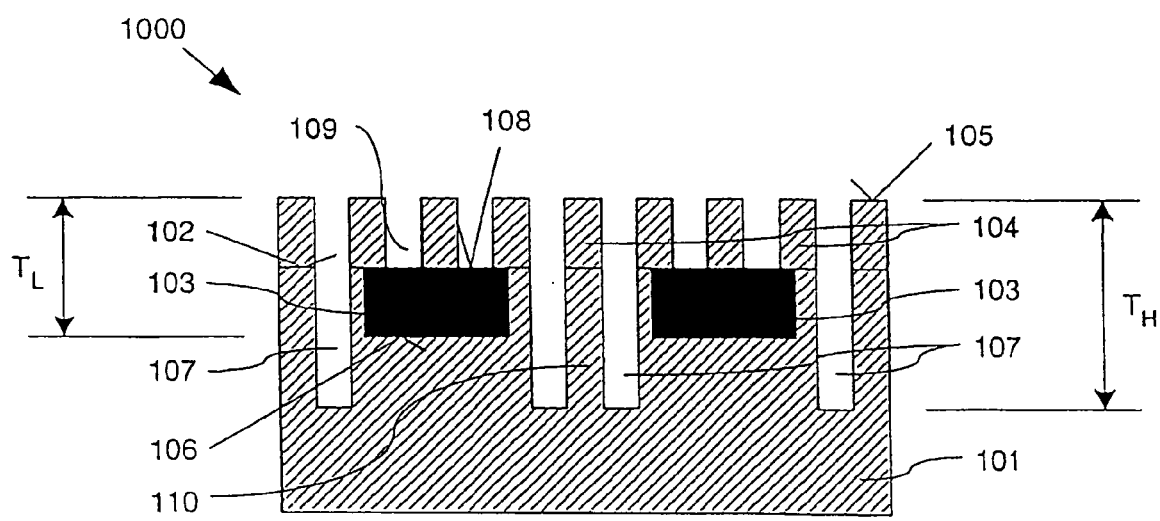
FIG. 10 shows a cross section perpendicular to the substrate surface through an as yet incomplete interconnect arrangement as shown in FIG. 1 at a second time during the second part of the method for fabricating the interconnect arrangement in accordance with the first exemplary embodiment.

Cavities 107 and additional cavities 109 are formed in the substrate 101 and the buffer layer 104 by means of etching from the buffer-layer surface 105 (cf. as yet incomplete interconnect arrangement 1000 in FIG. 10). The cavities 107 are arranged between adjacent interconnects 103 and have a cavity depth $T_H$. The cavity depth $T_H$ is greater than the interconnect depth $T_L$. As a result, the cavities 107 reduce the leakage fields between adjacent interconnects 103 in layers directly above and/or below the interconnects 103.

The additional interconnects 109 are delimited at the bottom by the interconnects 103. Posts 110 which are in the shape of a straight prism with a square base surface are arranged between the respective cavities 107, the respective additional cavities 109 and between the cavities 107 and the additional cavities 109. Alternatively, the posts 110 may also be shaped differently.

The cavities 107 and the additional cavities 109 are incorporated into the buffer layer 104 and the substrate 101 by means of standard lithography and etching processes. Careful patterning of the posts 110 should be ensured, so that the interconnect arrangement 100 which results after completion is sufficiently mechanically stable. It is necessary to find a compromise with regard to the requirement for the largest possible cavities 107 between adjacent interconnects 103. In conclusion, the maximum possible reduction in the effective relative dielectric constant $\in_r$ should be achieved, together with sufficient mechanical stability of the interconnect arrangement 100.

With regard to the choice of the etching process used, it is preferable to employ a selective etching process which removes the material of the substrate 101 and of the buffer layer 104 and therefore the silicon dioxide ($SiO_2$) but not the metal of the interconnects 103. Alternatively, the interconnects 103 may also be encapsulated by an etching stop layer if the silicon dioxide ($SiO_2$) cannot be etched selectively with respect to the metal of the interconnects 103.

After the as yet incomplete interconnect arrangement 1000 has been produced, the covering layer 111 is then produced in order to fabricate the finished interconnect arrangement 100.

The covering layer 111 made of silicon dioxide ($SiO_2$) is produced by means of a non-conformal process, substantially parallel to the buffer-layer surface 105, above the posts 110, the cavities 107 and the additional cavities 109. For this purpose, the silicon dioxide ($SiO_2$) is deposited by means of a CVD process with the minimum possible edge coverage, primarily on the remainders of the buffer-layer surface 105 and therefore on the posts 110. For this purpose, the CVD process is operated by means of an increase in pressure in the diffusion-determined regime. In an intermediate step, any silicon dioxide ($SiO_2$) which has penetrated deep into the cavities 107 and into the additional cavities 109 is removed again by means of a short isotropic etch in a downstream etching process before the cavities 107 and the additional cavities 109 are completely closed off.

During the non-conformal CVD process, the structure selected for the posts 110 means that scarcely any silicon dioxide ($SiO_2$) penetrates into the cavities 107 and the additional cavities 109. As a result, there is only very slight coverage of the cavity walls with silicon dioxide ($SiO_2$), and consequently the relative dielectric constant $\in_r$ of the finished interconnect arrangement 100 is only influenced to an insignificant extent.

After the cavities 107 and the additional cavities 109 have been closed off at the top by the non-conformal deposition of silicon dioxide ($SiO_2$), the remainder of the covering layer 111 can be produced by means of a conformal application of silicon dioxide ($SiO_2$). Finally, the covering layer 111 is delimited at the top by a covering-layer surface 112 which is oriented parallel to the substrate surface 102. The material used may also be any other insulating material which can be deposited using a non-conformal CVD process. Examples of such a material include fluorinated silicate glass (FSG), oxidized silicon carbide (SiOC) and polytetrafluoroethylene (PTFE).

This then results in the finished interconnect arrangement 100 in accordance with the first exemplary embodiment of the invention, which is illustrated in FIG. 1.

Alternatively, the covering layer 111 may also be applied to the posts 110 by means of a spin-on process. A process of this type is used primarily if the surface tension of the material which is to be spun on is sufficiently great. The wetting of the buffer-layer surface 105 should be sufficiently low to reduce penetration of the material which is to be spun on into the cavities 107 and the additional cavities 109. This is the case, inter alia, with materials such as for example polybenzoxazole (PBO) or spin-on glass (SOG).

In an alternative exemplary embodiment of the invention, it is possible that there are no additional cavities 109 above the interconnects 103. As a result, the interconnects 103 remain encapsulated by the insulating material of the buffer layer 104 and of the substrate 101. This has the advantage that, as a result, the interconnects 103 can be made more resistant to electromigration. The term electromigration is to be understood as meaning the migration of material of the interconnects 103 as a result of current flow, which can lead to the interconnects 103 being torn apart. The reduction in the coupling capacitance between adjacent interconnects 103 because of that is only affected to an insignificant extent.

Figure 11:
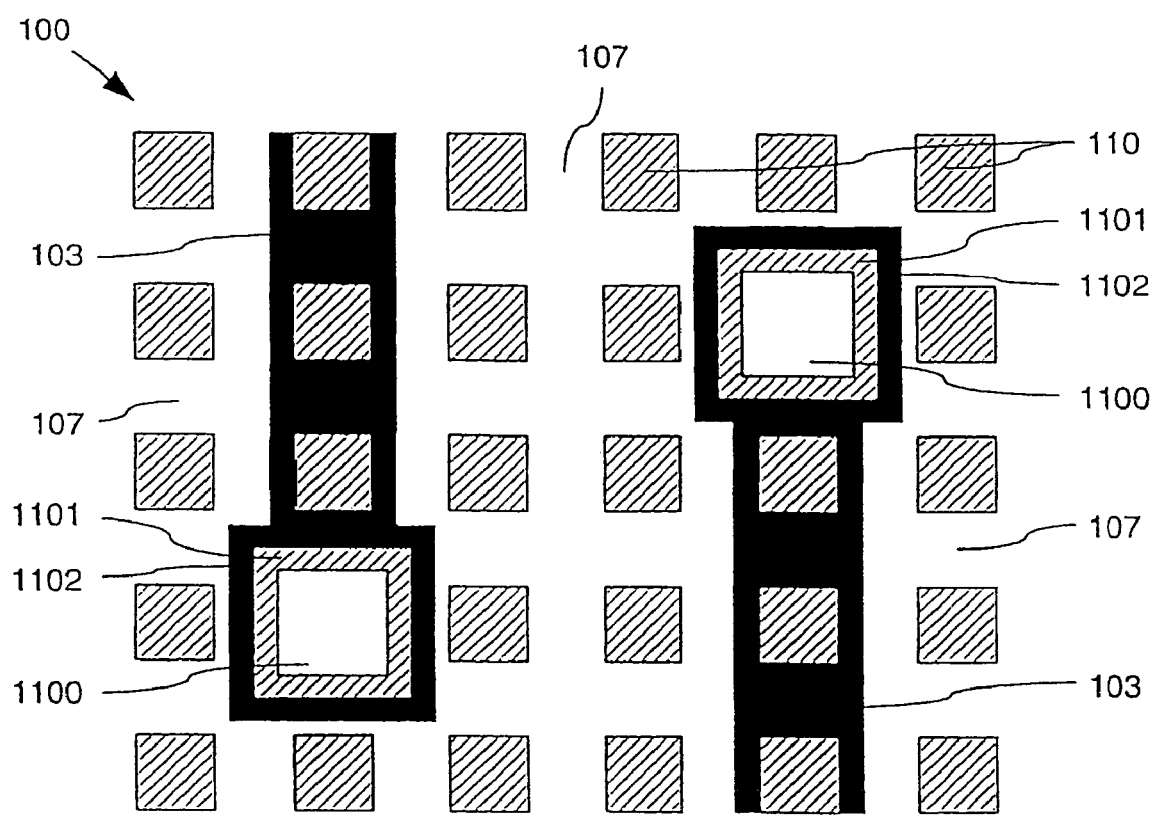
FIG. 11 shows a cross section parallel to the substrate surface through the interconnect arrangement in accordance with the first exemplary embodiment of the invention shown in FIG. 1.

FIG. 11 shows a cross section parallel to the substrate surface 102 through the interconnect arrangement 100 shown in FIG. 1.

This illustration makes it clear that in the interconnect arrangement 100 in accordance with the first exemplary embodiment there are also electrical contacts with other interconnect layers. The illustration shown in FIG. 11 also makes clear the arrangement of the interconnects 103, of the cavities 107 and of the posts 110.

To allow electrical contacts to be made between interconnect layers, contact holes 1100 are provided in the interconnect layer illustrated. The contact holes 1100 may accordingly be filled with electrically conductive material. Instead of posts 110, contact-hole insulations 1101 are provided in the region of the contact holes 1100. During the subsequent filling of the contact holes 1100 with electrically conductive material, the contact-hole insulations 1101 prevent undesirable electrical coupling between the contact holes 1100 and/or with the interconnects 103. Otherwise, undesirable electrical coupling of this type could form on account of the cavities 107 by means of electrically conductive material which has run.

The interconnects 103 widen in the region of the contact holes 1100 and form contact-hole claddings 1102. In this way, the interconnects 103 can be deliberately electrically coupled to the contact holes 1100 at defined locations. It is also possible to provide electrically insulated contact-hole claddings 1102 with respect to the contact holes 1100, by means of which claddings interconnects 103 can be guided past the contact holes 1100 in an electrically insulated manner. This may be necessary within an interconnect layer if, for example, a corresponding contact hole 1100 in this interconnect layer is only intended to make electrical contact between two interconnects which lie outside this interconnect layer, through this interconnect layer, without interconnects 103 in this interconnect layer being electrically contacted.

Figure 12:
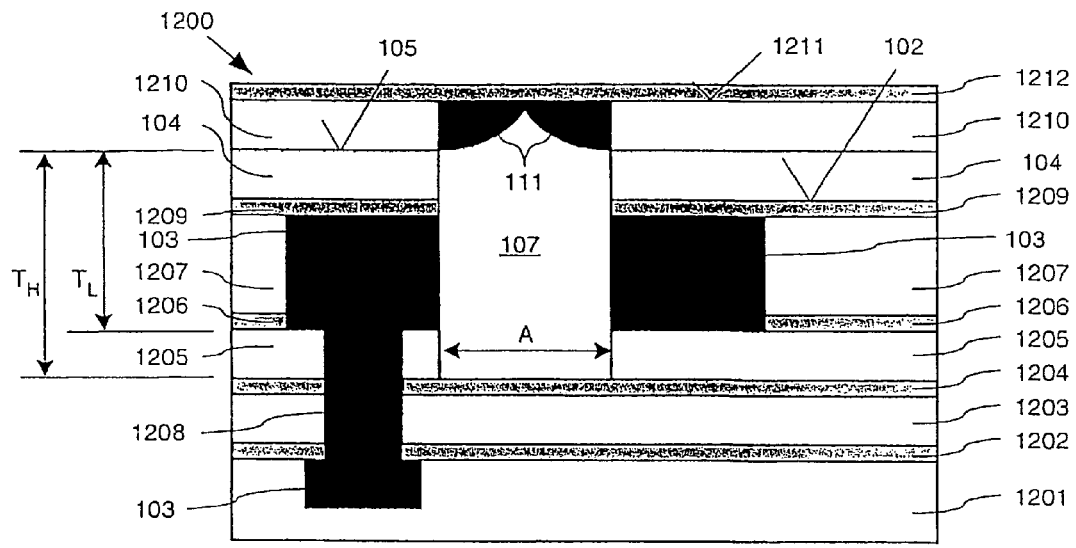
FIG. 12 shows a cross section perpendicular to the substrate surface through an interconnect arrangement in accordance with a second exemplary embodiment of the invention.

FIG. 12 shows a cross section perpendicular to the substrate surface 102 through an interconnect arrangement 1200 in accordance with a second exemplary embodiment of the invention.

The interconnect arrangement 1200 comprises a base substrate 1201. A first insulating material, according to the present exemplary embodiment silicon dioxide ($SiO_2$), is selected as the material for this base substrate 1201. An interconnect 103 made from an electrically conductive material, which according to the present exemplary embodiment includes aluminium or copper, is arranged in the base substrate 1201. Both the interconnect 103 and the base substrate 1201 are covered by a first stop layer 1202. Above the first stop layer 1202 there is a layer stack comprising, in succession, a first insulating layer 1203, a second stop layer 1204, a second insulating layer 1205, a third stop layer 1206, a third insulating layer 1207, a buffer layer 104 and a supporting layer 1210.

In accordance with the present exemplary embodiment, the first stop layer 1202, the second stop layer 1204, the third stop layer 1206 and the fourth stop layer 1209 each comprise silicon nitride ($Si_3N_4$), which is electrically insulating. According to the present exemplary embodiment, silicon dioxide ($SiO_2$) which is based on plasma-excited tetraethyl orthosilicate (PE-TEOS) is used as material for the first insulating layer 1203, the second insulating layer 1205, the third insulating layer 1207 and the buffer layer 104. According to the present exemplary embodiment, by contrast, plasma-enhanced silicon dioxide ($SiO_2$) which is based on silane ($SiH_4$) is used for the supporting layer 1210. The plasma-enhanced silicon dioxide ($SiO_2$) based on silane ($SiH_4$) is usually deposited in a PECVD process (PECVD= plasma-enhanced chemical vapour deposition).

The base substrate 1201, the first stop layer 1202, the first insulating layer 1203, the second stop layer 1204, the second insulating layer 1205, the third stop layer 1206, the third insulating layer 1207 and the fourth stop layer 1209 form the substrate 101 which is delimited at the top, in the upward direction of the layer stack, by a substrate surface 102. Parallel to the substrate surface 102, the buffer layer 104 is delimited at the top by a buffer-layer surface 105. In the buffer layer 104 and the substrate 101 there is arranged a cavity 107 which extends from the buffer-layer surface 105 into the substrate 101 as far as the second stop layer 1204 and comprises a cavity depth $T_H$.

The cavity 107 isolates two interconnects 103 which are buried in the substrate 101, partially replace the third stop layer 1206 and the third insulating layer 1207, and together define an interconnect layer. The interconnects 103 which are electrically isolated by means of the cavity 107 are arranged at an interconnect spacing A next to one another such that in each case the lower interconnect surface, perpendicular to the buffer-layer surface 105, has a spacing of an interconnect depth $T_L$ which is greater than the vertical thickness of the interconnects 103. The cavity depth $T_H$ is greater than the interconnect depth $T_L$, with the result that leakage fields between adjacent interconnects 103 are reduced in the regions of the buffer layer 104 and/or the substrate 101 which are directly above and below the interconnects 103. The cavity 107 has a width which is equal to the interconnect spacing A.

The interconnects 103 which partially replace the third stop layer 1206 and the third insulating layer 1207 are electrically coupled to the interconnect 103 located in the base substrate 1201 by means of an electrical contact 1208 and, according to the present exemplary embodiment, comprise the same material as the interconnect 103 located in the base substrate 1201. For this purpose, the electrical contact 1208 penetrates through the first stop layer 1202, the first insulating layer 1203, the second stop layer 1204 and the second insulating layer 1205, substantially perpendicular to the substrate surface 102.

The buffer layer 104 and the supporting layer 1210 are located above one another on the substrate surface 102, the cavity 107, as seen from the substrate surface 102, penetrating through the buffer layer 104 and projecting partially into the supporting layer 1210.

The cavity 107 is closed off at the top with respect to the buffer-layer surface 105 by means of a covering layer 111. The covering layer 111 includes an insulating material which accumulates selectively only at the supporting layer 1210. According to the present exemplary embodiment, silicon dioxide ($SiO_2$) which is based on ozone-activated tetraethyl orthosilicate ($O_3$/TEOS) is used as material for the covering layer 111. Of course, it is also possible to use a different material for the covering layer 111 if this material has the above-described selectivity in terms of its accumulation characteristics. Obviously, the covering layer 111 is designed in such a manner that it has a spandrel-shaped recess facing the cavity 107. Consequently, the supporting layer 1210 perpendicular to the buffer-layer surface 105 should have a sufficient thickness for the cavity 107 above the spandrel-shaped recess in the covering layer 111 also to be completely closed off by the covering layer 111.

The covering layer 111 and the supporting layer 1210 have a common covering layer/supporting layer surface 1211 which delimits these two layers 111, 1210 at the top, substantially parallel to the substrate surface 102. Finally, a fifth stop layer 1212, to which additional interconnect layers can be applied, is also arranged on this covering layer/supporting layer surface 1211. The geometry of the cavity 107 should preferably be selected in such a manner that the interconnect arrangement 1200 comprises sufficiently good electrical insulation for the interconnects 103 within an interconnect layer with a sufficient reduction in the relative dielectric constant $\in_r$. According to this exemplary embodiment, the interconnect spacing A and therefore the cavity 107 comprise a width of 400 . . . 500 nm which is almost equal to the width of the interconnects 103. According to this exemplary embodiment, the cavity depth $T_H$ corresponds to twice the thickness of the interconnects 103. According to this exemplary embodiment, the interconnects 103 comprise a thickness of approximately 600 nm. According to the present exemplary embodiment, the individual stop layers comprise a thickness of in each case approximately 50 nm. The insulation layers, apart from the third insulation layer 1207, and the buffer layer 104 and the supporting layer 1210, each comprise a thickness of approximately 150 nm according to the present exemplary embodiment. Alternatively, of course, it is also possible to select other suitable dimensions.

Either the Damascene technique or the metal-etching technique may be used to fabricate the interconnects 103. The Damascene technique is preferably used if copper is used as the material for the interconnects 103, while the metal-etching technique is preferably used if aluminium is used as the material for the interconnects 103.

In an exemplary embodiment of the invention which is not illustrated and substantially equates to the second exemplary embodiment of the invention, which has just been described, the cavity 107 may additionally extend through the second stop layer 1204 all the way to the boundary surface between the second stop layer 1204 and the first insulating layer 1203. Obviously, to increase the size of the cavity 107, the amount of material removed from the second stop layer 1204 in the region of the cavity 107 is such that the first insulating layer 1203 below it is just uncovered. This leads to an additional reduction in the effective relative dielectric constant $\in_r$. This is because the larger cavity 107 additionally reduces interfering electrical leakage fields between the interconnects 103.

Figure 13:
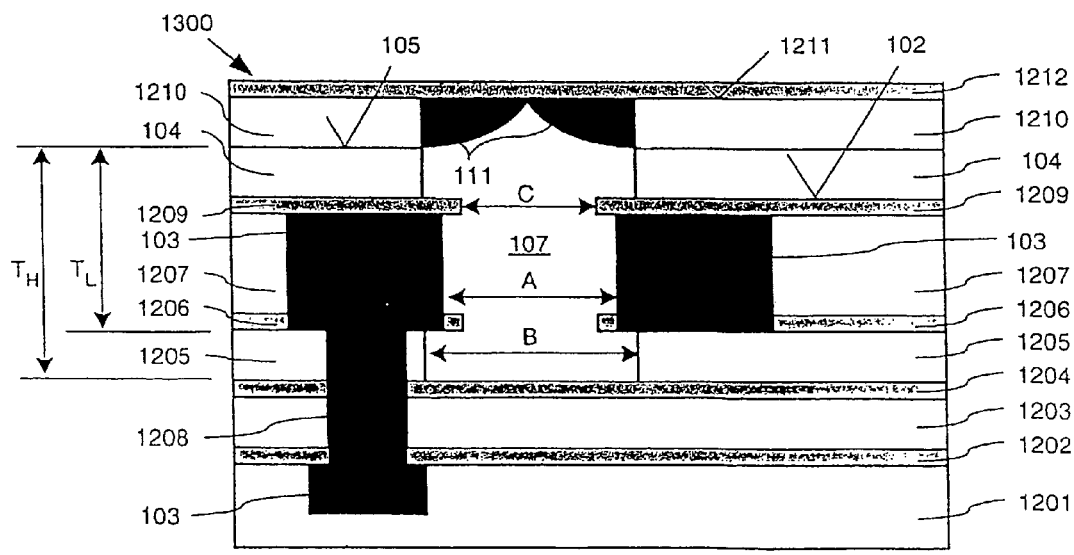
FIG. 13 shows a cross section perpendicular to the substrate surface through an interconnect arrangement in accordance with a third exemplary embodiment of the invention.

FIG. 13 shows a cross section perpendicular to the substrate surface 102 through an interconnect arrangement 1300 in accordance with a third exemplary embodiment of the invention.

The interconnect arrangement 1300 in accordance with the third exemplary embodiment is substantially identical to the interconnect arrangement 1200 in accordance with the second exemplary embodiment. The differences between the interconnect arrangement 1300 in accordance with the third exemplary embodiment and the interconnect arrangement 1200 in accordance with the second exemplary embodiment are as follows:

With respect to the substrate surface 102 and parallel to the plane of the drawing, the cavity 107 has a cavity width B which is greater than the interconnect spacing A. The result of this is that the shape of the cavity 107 is obviously similar to an "I" or to a bone. The greater extent of the cavity 107 above and below the interconnect layer formed by the adjacent interconnects 103 contributes to an additional reduction in the effective relative dielectric constant $\in_r$ in the interconnect arrangement 1300. This is because the larger cavity 107 additionally reduces interfering electrical leakage fields between the interconnects 103.

The third stop layer 1206 and the fourth stop layer 1209 comprise a hole width C in the region of the cavity 107 which is less than the interconnect spacing A. This is a result of the special fabrication method which has been used to fabricate the widened cavity 107 in the interconnect arrangement 1300 in accordance with the third exemplary embodiment.

The following text provides a stepwise description of a fabrication method for forming the interconnect arrangement 1200 in accordance with the second exemplary embodiment of the invention.

Figure 14:
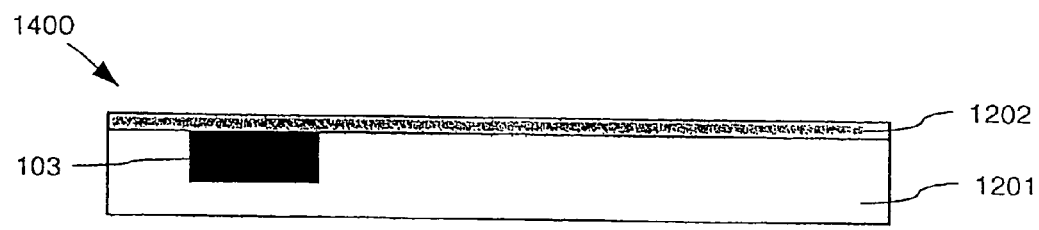
FIG. 14 shows a cross section perpendicular to the substrate surface through an as yet incomplete interconnect arrangement as shown in FIG. 12 at a first time during a method for fabricating the interconnect arrangement in accordance with the second exemplary embodiment.

FIG. 14 shows a cross section perpendicular to the substrate surface 102 through an as yet incomplete interconnect arrangement 1400 at a first time during a method for fabricating the interconnect arrangement 1200 shown in FIG. 12.

First of all, an interconnect 103 is introduced into the base substrate 1201 either by means of the Damascene technique or the metal-etching technique. The interconnect 103 and the base substrate 1201 are then covered by means of a first stop layer 1202 which is applied, for example, by means of a PECVD process. The first stop layer 1202 is used to perform the function of a protective mask for regions of the base substrate 1201 and/or the interconnect 103 which are not to be removed during subsequent fabrication of the electrical contact 1208 by means of an etching process.

Figure 15:
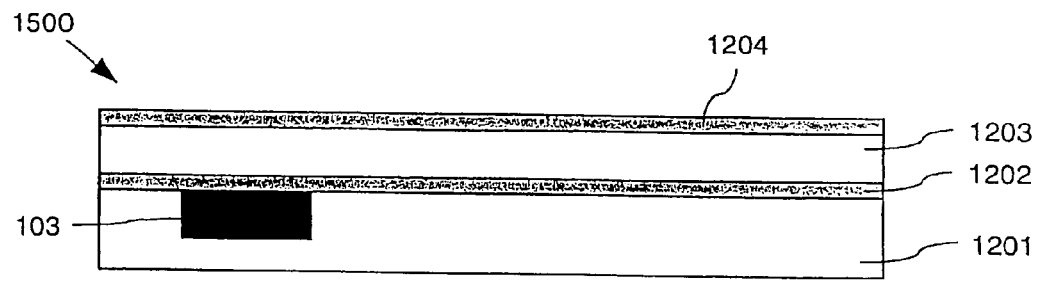
FIG. 15 shows a cross section perpendicular to the substrate surface through an as yet incomplete interconnect arrangement as shown in FIG. 12 at a second time during the method for fabricating the interconnect arrangement in accordance with the second exemplary embodiment.

The first insulating layer 1203 and the second stop layer 1204 are successively applied onto the first stop layer 1202, for example by means of a PECVD process. This then results in the as yet incomplete interconnect arrangement 1500 (cf. FIG. 15). The second stop layer 1204 is used, during a subsequent fabrication of the cavity 105 by means of an etching process, to delimit the cavity 105 at the bottom. Therefore, the second stop layer 1204 is responsible for the function of a protective mask for the layers below it.

Figure 16:
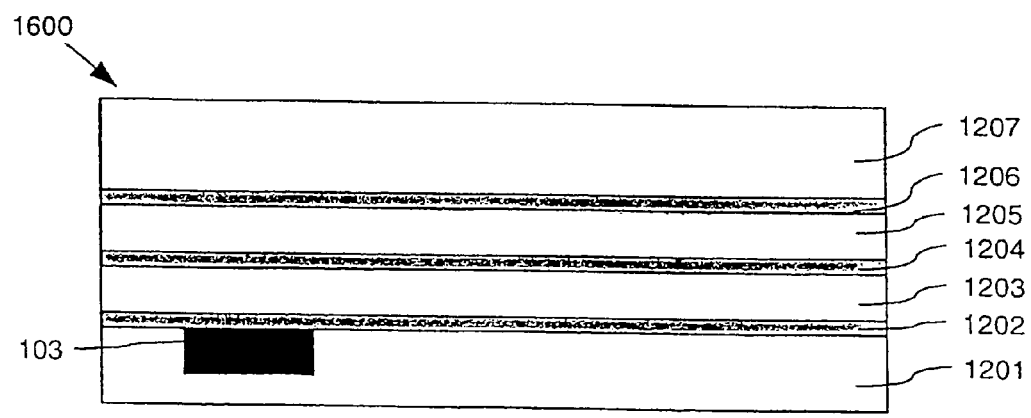
FIG. 16 shows a cross section perpendicular to the substrate surface through an as yet incomplete interconnect arrangement as shown in FIG. 12 at a third time during the method for fabricating the interconnect arrangement in accordance with the second exemplary embodiment.

The second insulating layer 1205, the third stop layer 1206 and the third insulating layer 1207 are successively applied to the second stop layer 1204, for example once again by means of a PECVD process. This then results in the as yet incomplete interconnect arrangement 1600 (cf. FIG. 16). The third stop layer 1206 is used, during subsequent fabrication of the recesses for the adjacent interconnects 130 which are to be fabricated by means of an etching process, to delimit these recesses at the bottom. Therefore, by suitable positioning of the third stop layer 1206 with respect to the third insulating layer 1207, it is possible to precisely set the thickness, i.e. the size perpendicular to the substrate surface 102, of the adjacent interconnects 103 which are to be fabricated.

Figure 17:
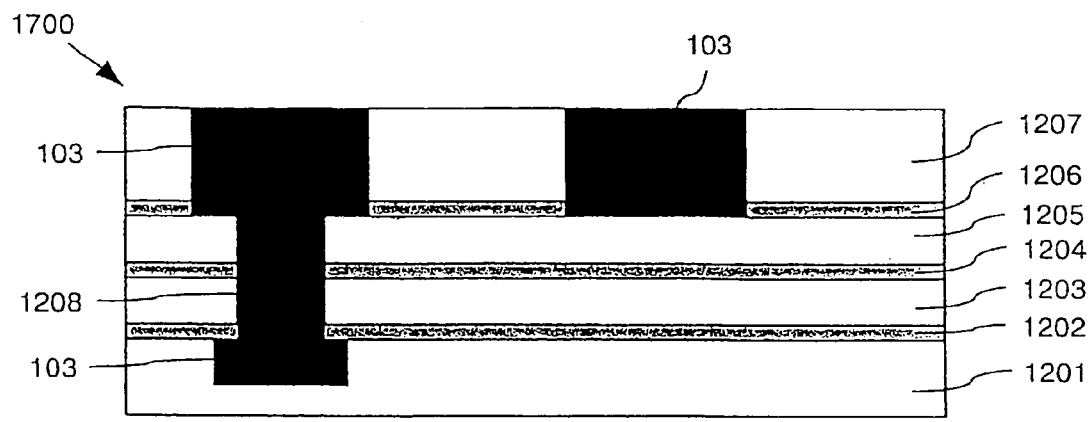
FIG. 17 shows a cross section perpendicular to the substrate surface through an as yet incomplete interconnect arrangement as shown in FIG. 12 at a fourth time during the method for fabricating the interconnect arrangement in accordance with the second exemplary embodiment.

FIG. 17 shows a cross section perpendicular to the substrate surface 102 through an as yet incomplete interconnect arrangement 1700 at a fourth time during the method for fabricating the interconnect arrangement 1200 shown in FIG. 12.

By means of a suitable sequence of anisotropic etching processes and subsequent introduction of electrically conductive material, the electrical contact 1208 and the adjacent interconnects 103 are fabricated in such a manner that the adjacent interconnects 103 are electrically coupled to the interconnect 103 which is integrated in the base substrate 1201. The first stop layer 1202 and the third stop layer 1206 are used for controlled fabrication of the electrical contact 1208. For this purpose, the stop layers are appropriately patterned in a suitable lithography and etching process.

Before the incorporation of the electrically conductive material for the electrical contact 1208 and the adjacent interconnects 103, the side faces which have formed in the corresponding layers can each be covered with a thin encapsulation layer (not shown) comprising an encapsulation material. These thin encapsulation layers are preferably fabricated from a nitride-containing material, so that they comprise a high mechanical hardness and are used to increase the resistance to electromigration of all those parts which are made from electrically conductive material.

The thin encapsulation layers are preferably produced by sputtering and are required in particular if copper is used as electrically conductive material. In this case, a seeding layer of copper is applied to the thin encapsulation layers, for example by sputtering. Electrochemical copper can then be deposited on this seeding layer. Alternatively, it is also possible for aluminium to be used as electrically conductive material instead of copper. However, copper is preferred on account of its lower electrical resistance and its higher natural resistance to electromigration than aluminium.

Furthermore, the thin encapsulation layers assist the selective accumulation of the insulating material for the covering layer 111 by preventing accumulation of corresponding material on the material of the adjacent interconnects 103.

Figure 18:
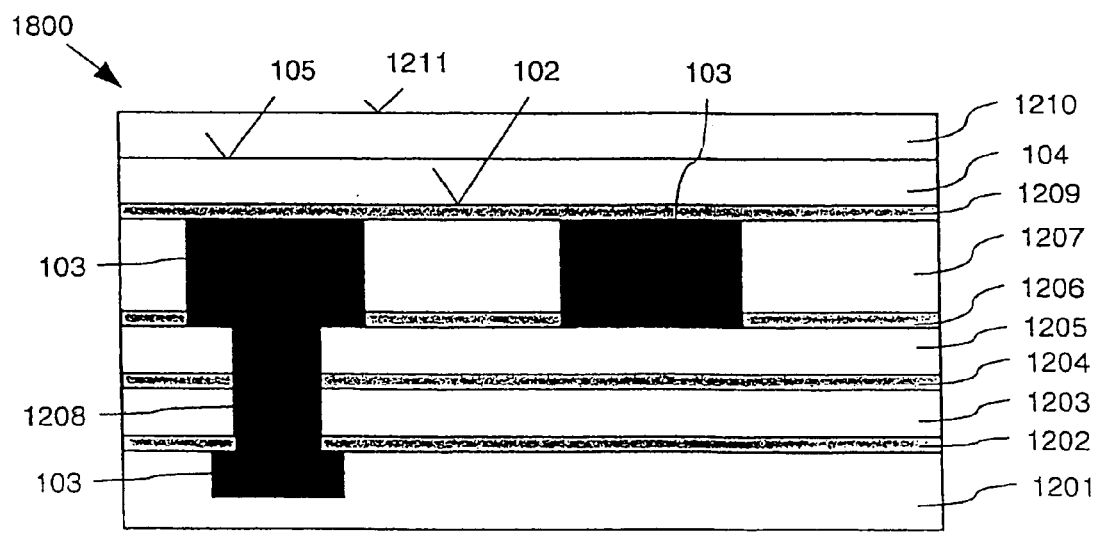
FIG. 18 shows a cross section perpendicular to the substrate surface through an as yet incomplete interconnect arrangement as shown in FIG. 12 at a fifth time during the method for fabricating the interconnect arrangement in accordance with the second exemplary embodiment.

FIG. 18 shows a cross section perpendicular to the substrate surface 102 through an as yet incomplete interconnect arrangement 1800 at a fifth time during the method for fabricating the interconnect arrangement 1200 shown in FIG. 12.

Then, the fourth stop layer 1209 is arranged above the third insulating layer 1207 and the interconnects 103 embedded therein, for example using a PECVD process. The fourth stop layer 1209 serves as a diffusion barrier for the electrically conductive material of the adjacent interconnects 103 at the top. The layer stack 1201 to 1209 forms the substrate 101 which is delimited at the top by the substrate surface 102. Then, the buffer layer 104 and the supporting layer 1210 are successively arranged above the fourth stop layer 1209, for example once again by means of a PECVD process.

From the surface of the supporting layer 1210 which is substantially parallel to but remote from the substrate surface 102, the cavity 107 is incorporated into the supporting layer 1210, the buffer layer 104, the fourth stop layer 1209, the third insulating layer 1207, the third stop layer 1206 and the second insulating layer 1205, for example by means of a sequence of conventional lithography and etching processes. This then results in the as yet incomplete interconnect arrangement 1900 (cf. FIG. 19). The second stop layer 1204 therefore delimits the cavity 107 at the bottom in the direction of the first insulating layer 1203. Alternatively, it is also possible for the second stop layer 1204 to be etched away selectively, so that the cavity 107 is delimited at the bottom by the uncovered region of the first insulating layer 1203 (not shown).

If, as a result of a misalignment of a lithography mask, insulating material remains in place next to one of the adjacent interconnects 103, it is nevertheless possible to form a cavity. However, this leads to an undesirable increase in the relative dielectric constant $\in_r$. However, misalignment does not cause any problems in the fabrication of the selective insulating layer 2001 described below.

Since, according to the present exemplary embodiment, plasma-enhanced silicon dioxide ($SiO_2$) based on silane ($SiH_4$) is used as the material for the supporting layer 1210, it is now possible for a selective insulation layer 2001 to be applied to the supporting layer 1210. This then results in the as yet incomplete interconnect arrangement 2000 (cf. FIG. 20). According to the present exemplary embodiment, silicon dioxide ($SiO_2$) which is based on ozone-activated tetraethyl orthosilicate ($O_3$/TEOS) is used as the material for the selective insulation layer 2001. The selective insulation layer 2001 covers all the surfaces of the supporting layer 1210 which have previously been uncovered and is, as can be seen, in the shape of a bead which overhangs the supporting layer 1210.

If, furthermore, material for the selective insulation layer 2001 is applied to the supporting layer 1201, the selective insulation layer 2001 grows together to form the continuous selective insulation layer 2101. This then results in the as yet incomplete interconnect arrangement 2100 (cf. FIG. 21). The continuous selective insulation layer 2101 now closes off the cavity 107 completely at the top, the continuous selective insulation layer 2101 comprising a spandrel-shaped recess 2102 directed towards the cavity 107.

To allow the application of additional interconnect layers to the interconnect arrangement 1200 according to the invention, the continuous selective insulation layer 2101 is partially removed again for example by means of a chemical mechanical polishing process and is levelled during this process until a covering layer/supporting layer surface 1211 which is substantially parallel to the substrate surface 102 is formed. The continuous selective insulation layer 2101 is planarized in particular until the supporting layer 1210 parallel to the substrate surface 102 is uncovered again. In this way, the covering layer 111 is formed from the continuous selective insulation layer 2101. This then results in the as yet incomplete interconnect arrangement 2200 (cf. FIG. 22). When selecting the width of the cavity 107 and therefore the interconnect spacing A and the thickness of the supporting layer 1210, it should preferably be ensured that, during the planarization of the continuous selective insulation layer 2101, the cavity 107 remains completely closed off at the top, i.e. the spandrel-shaped recess 2102 is not opened up at the top.

If, on the side which is remote from the substrate 101, i.e. above the covering layer/supporting layer surface 1211, the fifth stop layer 1212 is then produced above the uncovered regions of the supporting layer 1210 and the covering layer 111, for example by means of a PECVD process, the result is the interconnect arrangement 1200 in accordance with the second exemplary embodiment as illustrated in FIG. 12.

For interconnect layers which are additionally to be applied to the interconnect arrangement 1200 in accordance with the second exemplary embodiment, the fifth stop layer 1212, with regard to additional cavities, has the same function as the second stop layer 1204 for the cavity 107 in the interconnect arrangement 1200 in accordance with the second exemplary embodiment.

The method for fabricating the interconnect arrangement 1300 in accordance with the third exemplary embodiment is substantially identical to the method for fabricating the interconnect arrangement 1200 in accordance with the second exemplary embodiment. Therefore, this figure and the figure which follows deal only with the two times at which the most significant differences between the two fabrication methods occur.

Figure 23:
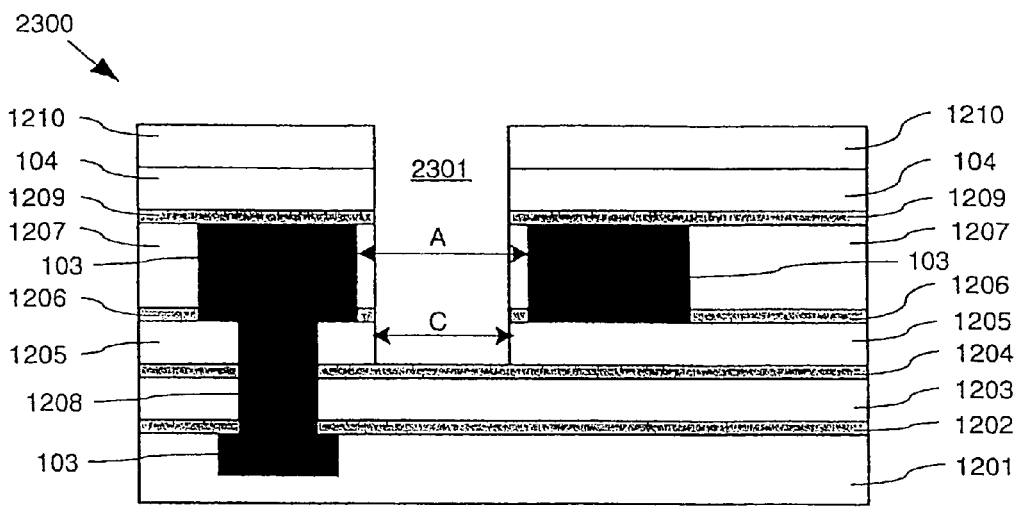
FIG. 23 shows a cross section perpendicular to the substrate surface through an as yet incomplete interconnect arrangement as shown in FIG. 13 at a first time during a method for fabricating the interconnect arrangement in accordance with the third exemplary embodiment.

FIG. 23 shows a cross section perpendicular to the substrate surface 102 through an as yet incomplete interconnect arrangement 2300 at a first time during a method for fabricating the interconnect arrangement 1300 shown in FIG. 13.

Figure 19:
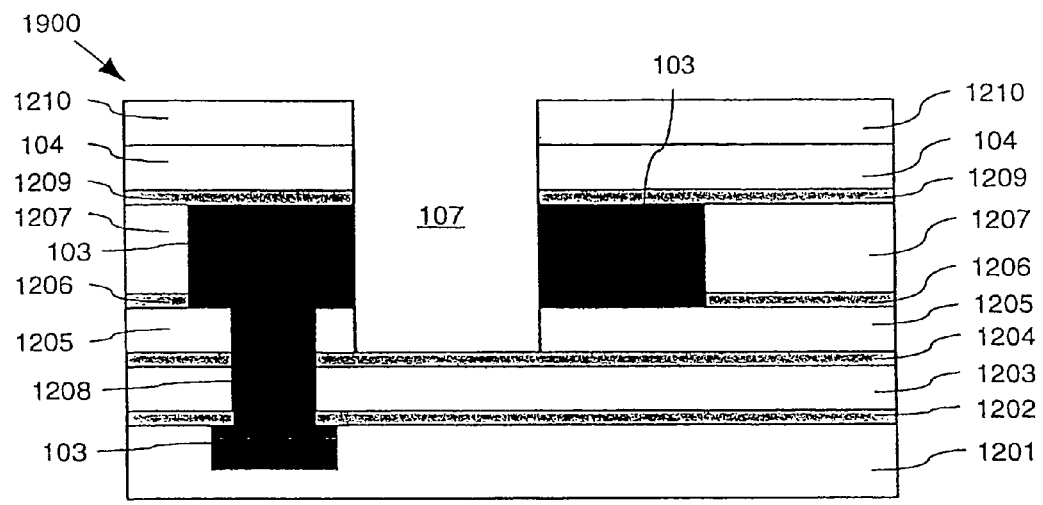
FIG. 19 shows a cross section perpendicular to the substrate surface through an as yet incomplete interconnect arrangement as shown in FIG. 12 at a sixth time during the method for fabricating the interconnect arrangement in accordance with the second exemplary embodiment.

In order, in the event of possible misalignment of a lithography mask for producing the cavity 107, nevertheless to be able to produce a cavity 107 with a width corresponding to the interconnect spacing A, according to the third exemplary embodiment, as an alternative to the partial section described in FIG. 19, during the fabrication method first of all a hole 2301 is incorporated from the surface of the supporting layer 1210 which is substantially parallel to but remote from the substrate surface 102, into the supporting layer 1210, the buffer layer 104, the fourth stop layer 1209, the third insulating layer 1207, the third stop layer 1206 and the second insulating layer 1205, for example by means of a sequence of conventional lithography and etching processes. The second stop layer 1204 therefore delimits the hole 2301 at the bottom in the direction of the first insulating layer 1203.

The hole 2301 has a hole width C which is less than the interconnect spacing A. Therefore, in the region of the cavity 107 which is to be formed, the lithography and etching masks can be positioned more easily within the interconnect spacing A. As a result, some of the electrically insulating material of the third insulating layer 1207 remains in place at least between one of the adjacent interconnects 103 and the hole 2301.

In order then to avoid an insufficient reduction in the effective relative dielectric constant $\in_r$ between the adjacent interconnects 103, an isotropic etching process is carried out after the hole 2301 has been produced. This isotropic etching process is set selectively, in such a manner that only electrically insulating material of the second insulating layer 1205, of the third insulating layer 1207, of the buffer layer 104 and of the supporting layer 1210 is removed. However, during the isotropic etching process, neither electrically insulating material of the second stop layer 1204, of the third stop layer 1206 and of the fourth stop layer 1209 nor electrically conductive material of the adjacent interconnects 103 is to be removed. In particular, during this isotropic etching process the second stop layer 1204 prevents undesirable removal of electrically insulating material of the first insulating layer 1203. According to the present exemplary embodiment, dilute hydrofluoric acid (HF), which preferably etches the electrically insulating material used in accordance with the present exemplary embodiment for the second insulating layer 1205, the third insulating layer 1207, the buffer layer 104 and the supporting layer 1210, namely silicon dioxide ($SiO_2$), is used for the isotropic etch.

The cavity 107 is formed from the hole 2301 by means of the isotropic etching process. This then results in the as yet incomplete interconnect arrangement 2400 (cf. FIG. 24). The result of suitable matching of the duration of the selective etching process is that the vertical edges of the cavity 107 are set back with respect to those of the adjacent interconnects 103, i.e. the cavity width B above and below the interconnect layer with the adjacent interconnects 103 is greater than the interconnect spacing A. This has the advantage that an additional reduction in the effective relative dielectric constant $\in_r$ can be achieved. Furthermore, the isotropic etching process used has the advantage that contamination effects are as far as possible avoided during the patterning and production of the cavity 107.

Figure 20:
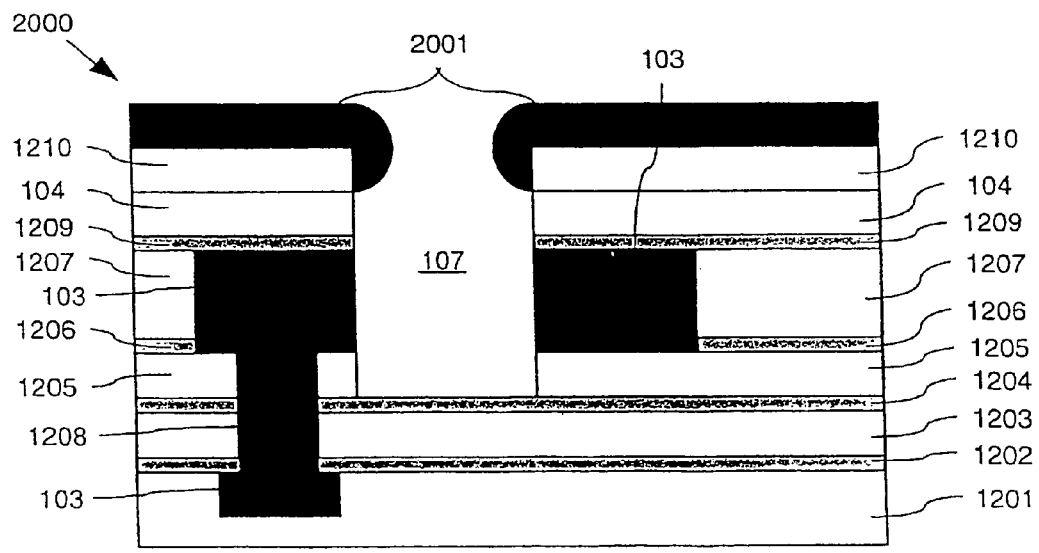
FIG. 20 shows a cross section perpendicular to the substrate surface through an as yet incomplete interconnect arrangement as shown in FIG. 12 at a seventh time during the method for fabricating the interconnect arrangement in accordance with the second exemplary embodiment.
Figure 21:
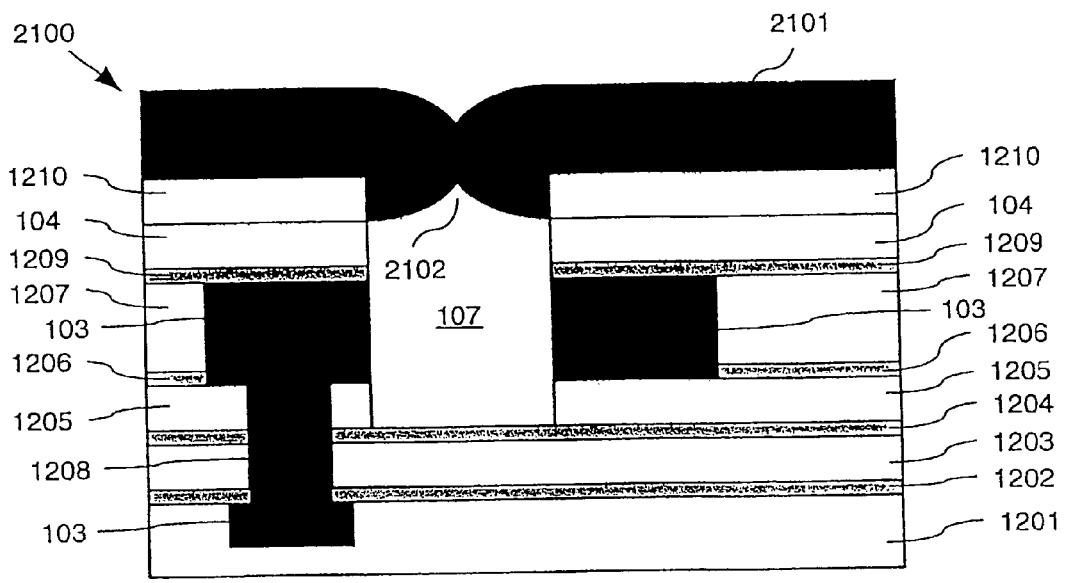
FIG. 21 shows a cross section perpendicular to the substrate surface through an as yet incomplete interconnect arrangement as shown in FIG. 12 at an eighth time during the method for fabricating the interconnect arrangement in accordance with the second exemplary embodiment.
Figure 22:
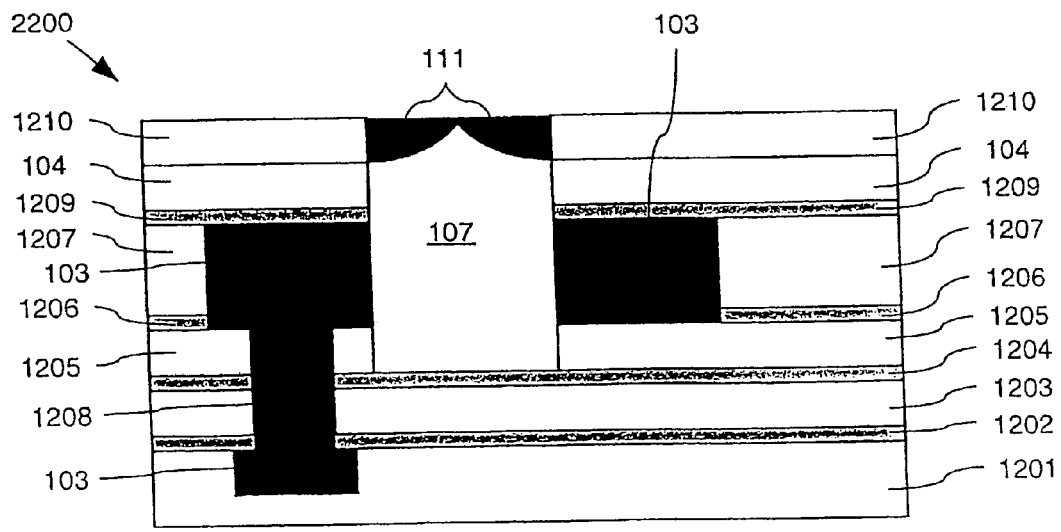
FIG. 22 shows a cross section perpendicular to the substrate surface through an as yet incomplete interconnect arrangement as shown in FIG. 12 at a ninth time during the method for fabricating the interconnect arrangement in accordance with the second exemplary embodiment.
Figure 24:
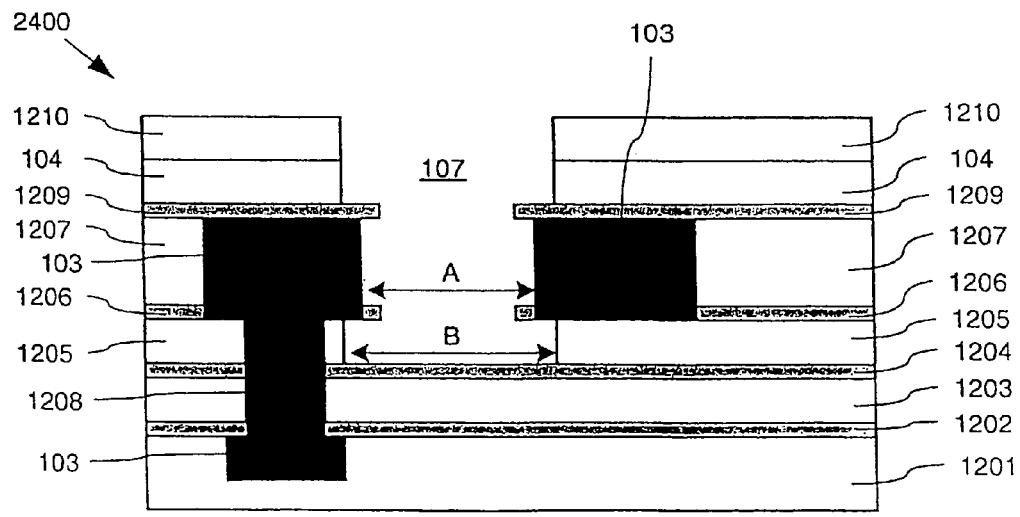
FIG. 24 shows a cross section perpendicular to the substrate surface through an as yet incomplete interconnect arrangement as shown in FIG. 13 at a second time during the method for fabricating the interconnect arrangement in accordance with the third exemplary embodiment.

The as yet incomplete interconnect arrangement 2400 illustrated in FIG. 24 can then be processed further in a similar way to that which has been carried out in the description relating to FIG. 20 to FIG. 22, which then, after completion, results in the interconnect arrangement 1300 in accordance with the third exemplary embodiment. In the interconnect arrangement 1300 in accordance with the third exemplary embodiment, it is possible, by means of the proposed fabrication method, to achieve an effective relative dielectric constant of $\in_r \leq 2$ and in particular of $\in_r = 1.9$.

To form an inventive interconnect arrangement in accordance with one of the exemplary embodiments, it is also possible for other suitable insulating materials and fabrication processes to be used instead of the selected insulation materials and their fabrication processes.

By way of example, all insulating low-k materials with a low relative dielectric constant $\in_r$ which can be applied in a spin-on process and comprise a low viscosity are suitable as third electrically insulating material for the covering layer 111. In a spin-on process, the material which is to be applied and is generally in liquid form is applied during a spin-coating operation to the surfaces which are to be coated by being spun on.

If, in the first exemplary embodiment of the invention, a low-k material with a high viscosity is used as second insulating material and as a result no second insulating material penetrates into the cavities 107 and the additional cavities 109, the low-k material can be used directly to form the covering layer 111. Otherwise, first of all, to close off the cavities 107 and the additional cavities 109, silicon dioxide ($SiO_2$) is deposited non-conformally above the posts 110, and only then is the low-k material deposited as covering layer 111.

LIST OF REFERENCE SYMBOLS

100 Interconnect arrangement in accordance with the first exemplary embodiment
101 Substrate
102 Substrate surface
103 Interconnect
104 Buffer layer
105 Buffer-layer surface
106 Lower interconnect surface
107 Cavity
108 Upper interconnect surface
109 Additional cavity
110 Post
111 Covering layer
112 Covering-layer surface
$T_L$ Interconnect depth
$T_H$ Cavity depth
200 As yet incomplete interconnect arrangement in accordance with the first exemplary embodiment at a first time during a first fabrication method
201 Trench
300 As yet incomplete interconnect arrangement in accordance with the first exemplary embodiment at a second time during the first fabrication method
301 Metal layer
302 Filled trench
400 As yet incomplete interconnect arrangement in accordance with the first exemplary embodiment at a third time during the first fabrication method
401 Interconnect
500 As yet incomplete interconnect arrangement in accordance with the first exemplary embodiment at a fourth time during the first fabrication method
600 As yet incomplete interconnect arrangement in accordance with the first exemplary embodiment at a first time during a second fabrication method
601 Substrate
602 Substrate surface
603 Interconnect
700 As yet incomplete interconnect arrangement in accordance with the first exemplary embodiment at a second time during the second fabrication method
701 Cladding layer
800 As yet incomplete interconnect arrangement in accordance with the first exemplary embodiment at a third time during the second fabrication method
801 Planarized cladding layer
802 Cladding-layer surface
900 As yet incomplete interconnect arrangement in accordance with the first exemplary embodiment at a first time during a common further fabrication method 1000 As yet incomplete interconnect arrangement in accordance with the first exemplary embodiment at a second time during the common further fabrication method
1100 Contact hole
1101 Contact-hole insulation
1102 Contact-hole cladding
1200 Interconnect arrangement in accordance with the second exemplary embodiment
1201 Base substrate
1202 First stop layer
1203 First insulation layer
1204 Second stop layer
1205 Second insulation layer
1206 Third stop layer
1207 Third insulation layer
1208 Electrical contact
1209 Fourth stop layer
1210 Supporting layer
1211 Covering layer/supporting layer surface
1212 Fifth stop layer
A Interconnect spacing
1300 Interconnect arrangement in accordance with third exemplary embodiment
B Cavity width
C Hole width
1400 As yet incomplete interconnect arrangement in accordance with the second exemplary embodiment at a first time during a fabrication method
1500 As yet incomplete interconnect arrangement in accordance with the second exemplary embodiment at a second time during the fabrication method
1600 As yet incomplete interconnect arrangement in accordance with the second exemplary embodiment at a third time during the fabrication method
1700 As yet incomplete interconnect arrangement in accordance with the second exemplary embodiment at a fourth time during the fabrication method
1800 As yet incomplete interconnect arrangement in accordance with the second exemplary embodiment at a fifth time during the fabrication method
1900 As yet incomplete interconnect arrangement in accordance with the second exemplary embodiment at a sixth time during the fabrication method
2000 As yet incomplete interconnect arrangement in accordance with the second exemplary embodiment at a seventh time during the fabrication method
2001 Selective insulation layer
2100 As yet incomplete interconnect arrangement in accordance with the second exemplary embodiment at an eighth time during the fabrication method
2101 Continuous selective insulation layer
2102 Spandrel-shaped recess
2200 As yet incomplete interconnect arrangement in accordance with the second exemplary embodiment at a ninth time during the fabrication method
2300 As yet incomplete interconnect arrangement in accordance with the third exemplary embodiment at a first time during a fabrication method (cf. 1900)
2301 Hole
2400 As yet incomplete interconnect arrangement in accordance with the third exemplary embodiment at a second time during the fabrication method

The invention claimed is:

1. A method for fabricating an interconnect arrangement, comprising:

producing at least two electrically conductive interconnects in a substrate below a substrate surface by means of a first lithography and etching method, the substrate comprising a first electrically insulating material and the interconnects comprising an electrically conductive material, and the interconnects being arranged next to one another in the substrate, producing a buffer layer made from a second electrically insulating material above the substrate surface, the buffer layer comprising a buffer-layer surface which is parallel to the substrate surface, producing a cavity, which runs between the interconnects and extends from the buffer-layer surface through the buffer layer into the substrate, by means of a second lithography and etching method, the cavity, with respect to the buffer-layer surface, extending deeper into the substrate than the interconnects, producing a covering layer made from a third electrically insulating material above the buffer layer, so that the cavity is completely closed off with respect to the buffer-layer surface, and wherein the interconnect arrangement is formed from the substrate, the interconnects, the buffer layer and the covering layer, and arranging a supporting layer made from a fourth electrically insulating material above the buffer-layer surface, the fourth electrically insulating material being different from the first, second or third electrically insulating material, the third electrically insulating material being adapted for optional selective deposition only on the fourth electrically insulating material.

2. A method for fabricating an interconnect arrangement, comprising:

producing at least two electrically conductive interconnects in a substrate below a substrate surface by means of a first lithography and etching method, the substrate comprising a first electrically insulating material and the interconnects comprising an electrically conductive material, and the interconnects being arranged next to one another in the substrate, producing a buffer layer made from a second electrically insulating material above the substrate surface, the buffer layer comprising a buffer-layer surface which is parallel to the substrate surface, producing a cavity, which runs between the interconnects and extends from the buffer-layer surface through the buffer layer into the substrate, by means of a second lithography and etching method, the cavity, with respect to the buffer-layer surface, extending deeper into the substrate than the interconnects, producing a covering layer made from a third electrically insulating material above the buffer layer, so that the cavity is completely closed off with respect to the buffer-layer surface, and wherein the interconnect arrangement is formed from the substrate, the interconnects, the buffer layer and the covering layer, and producing from the buffer-layer surface several cavities extending between the interconnects.

3. A method according to claim 1, in which the interconnects are produced as buried interconnects in the substrate.

4. A method according to claim 1, further comprising, before the covering layer is produced, producing an additional cavity between the buffer-layer surface and the interconnects above the interconnects, the additional cavity extending less deeply into the buffer layer or the substrate, respectively, than the cavity.

5. A method according to claim 1, in which the covering layer is produced in a process with a low edge coverage.

6. A method according to claim 1, further comprising producing a plurality of cavities, which extend between the interconnects, starting from the buffer-layer surface.

7. A method according to claim 2, further comprising producing a supporting layer made from a fourth electrically insulating material above the buffer-layer surface, the fourth electrically insulating material being different from the first, second or third electrically insulating material, and the third electrically insulating material optionally being deposited selectively only on the fourth electrically insulating material.

8. A method according to claim 1, wherein the cavity is produced by first producing a suitable etching mask on the supporting layer, then using an etching process in regions of the supporting layer which are not covered by the etching mask to remove material from the supporting layer, the buffer layer and the substrate in a predetermined way, and then removing the etching mask.

9. A method according to claim 8, further comprising providing a substrate which comprises a stop layer below the interconnects, relative to the substrate surface, and in which the etching process for producing the cavity in the substrate is delimited at the bottom by means of the stop layer.

10. A method according to claim 9, further comprising selectively removing the stop layer in the region of the cavity, so that regions of the substrate which are arranged below the stop layer are uncovered.

11. A method according to claim 1, wherein the producing a covering layer comprises selectively depositing third electrically insulating material only on the fourth electrically insulating material, at least until the cavity has been completely closed off, and then partially removing the third electrically insulating material which has been deposited on the supporting layer by chemical mechanical polishing to level the covering layer.

12. A method according to claim 1, further comprising producing an additional stop layer, adapted for application of additional interconnect layers thereto, above the supporting layer and the covering layer.

13. A method according to claim 1, in which the interconnects are arranged at a spacing from one another which is less than the extent of the cavity in the direction of the spacing between the interconnects above and/or below the interconnects.

14. A method according to claim 1, in which the producing the interconnects comprising producing the interconnects at substantially the same depth with respect to the substrate surface, further wherein producing the cavity comprising producing the cavity extending substantially vertically into the substrate.

15. A method according to claim 1, further comprising encapsulating the interconnects with a thin encapsulation layer made from an encapsulation material, the encapsulation material being mechanically harder than the electrically conductive material, mechanically harder than the first electrically insulating material and mechanically harder than the second electrically insulating material.

16. A method according to claim 1, in which the interconnects are produced at least partially on electrically conductive regions in the substrate, for making electrical contacts between various interconnect layers.

17. A method according to claim 1, in which the cavity is formed as partially extending into the covering layer.

18. A method according to claim 1, in which the covering layer, in the region of the buffer layer, extends partially into the cavity, the covering layer, as seen from the buffer-layer surface, comprising a decreasing edge coverage in the cavity, so that the covering layer in the cavity does not extend all the way to the substrate surface.

19. A method according to claim 1, in which the covering layer covers the buffer layer and in which there is at least one additional cavity between the interconnects and the buffer-layer surface, the cavity extending deeper into the buffer layer or the substrate than the additional cavity.

20. A method according to claim 1, further comprising forming, above the supporting layer and the covering layer, an additional stop layer adapted for provision of additional interconnects thereon.

21. A method according to claim 1, in which the interconnects are arranged at a distance from one another which is less than the extent of the cavity in the direction of the spacing between the interconnects above and/or below the interconnects.

22. A method according to claim 1, in which the first electrically insulating material and the second electrically insulating material are identical.

23. A method according to claim 1, in which the first electrically insulating material and/or the second electrically insulating material and/or the third electrically insulating material and/or the fourth electrically insulating material are/is a low-k material which has a relative dielectric constant $\in_r$ in the range between 1 and 4.

24. A method according to claim 1, in which the first electrically insulating material and/or the second electrically insulating material and/or the third electrically insulating material and/or the fourth electrically insulating material comprise(s) an organic material.

25. A method according to claim 1, in which the first electrically insulating material and/or the second electrically insulating material and/or the fourth electrically insulating material comprise(s) silicon dioxide.

26. A method according to claim 15, in which the encapsulation material is a nitride compound.

27. A method according to claim 1, in which the interconnects are arranged at least partially on electrically conductive regions in the substrate for making electrical contacts between various interconnect layers.

* * * * *

UNITED STATES PATENT AND TRADEMARK OFFICE
CERTIFICATE OF CORRECTION

| | |
|---|---|
| PATENT NO. | : 7,033,926 B2 |
| APPLICATION NO. | : 10/487190 |
| DATED | : April 25, 2006 |
| INVENTOR(S) | : Günther Schindler et al. |

It is certified that error appears in the above-identified patent and that said Letters Patent is hereby corrected as shown below:

Column 19, line 58, delete "$\leqq$" and insert in place thereof --$\leq$--.

Signed and Sealed this

Eighteenth Day of December, 2007

JON W. DUDAS
*Director of the United States Patent and Trademark Office*